US011395435B2

(12) United States Patent
Chen et al.

(10) Patent No.: US 11,395,435 B2
(45) Date of Patent: Jul. 19, 2022

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chien-Li Huang, Kaohsiung (TW); Hsiu-Fen Chiu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 17/111,775

(22) Filed: Dec. 4, 2020

(65) Prior Publication Data

US 2022/0061184 A1    Feb. 24, 2022

(30) Foreign Application Priority Data

Aug. 20, 2020 (TW) ................... 109128724
Aug. 28, 2020 (TW) ................... 109129819
Sep. 16, 2020 (TW) ................... 109132307

(51) Int. Cl.
*H05K 7/00* (2006.01)
*H05K 7/18* (2006.01)

(52) U.S. Cl.
CPC ............. *H05K 7/183* (2013.01); *H05K 7/186* (2013.01)

(58) Field of Classification Search
CPC .......... H05K 7/183; H05K 7/186; H05K 7/00; H05K 7/1489; H05K 7/1421; H05K 7/14; H05K 5/00; A47B 88/483; A47B 88/43; A47B 57/545; A47B 57/485
USPC ......... 312/223.1, 223.2, 265.1–365.4, 334.4, 312/334.5; 174/50; 211/26; 361/727, 361/724, 683; 248/220.43
See application file for complete search history.

(56) References Cited

U.S. PATENT DOCUMENTS

| 6,181,549 | B1  | 1/2001  | Mills et al. |
| 6,644,481 | B2  | 11/2003 | Dean et al. |
| 6,659,292 | B2* | 12/2003 | Gough ................ A47B 88/407 211/26 |
| 6,685,033 | B1  | 2/2004  | Baddour et al. |

(Continued)

FOREIGN PATENT DOCUMENTS

| CN | 108811429 | * 11/2018 |
| CN | 208523101 | * 2/2019 |

(Continued)

*Primary Examiner* — Janet M Wilkens
(74) *Attorney, Agent, or Firm* — Alan D. Kamrath; Karin L. Williams; Mayer & Williams PC

(57) ABSTRACT

A slide rail assembly includes a first rail, a bracket, a second rail and a locking device. The bracket is arranged on the first rail and has a locking part. The second rail is movable relative to the first rail from a retracted position to an extended position. The locking device is arranged on the second rail. The locking device comprises a locking base and a locking member. The locking base is configured to be operated relative to the second rail to be in one of an open state and a closed state. When the locking base is in the closed state, the locking member corresponds to the locking part of the bracket. When the locking base is in the open state, the locking member is away from the locking part of the bracket.

15 Claims, 18 Drawing Sheets

(56) References Cited

U.S. PATENT DOCUMENTS

| | | | |
|---|---|---|---|
| 7,364,244 B2 | 4/2008 | Sandoval | |
| 10,051,759 B1* | 8/2018 | Chen | A47B 57/545 |
| 2010/0072153 A1* | 3/2010 | Chen | H05K 7/1421 |
| | | | 211/183 |
| 2012/0076446 A1* | 3/2012 | Chen | A47B 88/43 |
| | | | 384/21 |
| 2017/0215298 A1 | 7/2017 | Chen et al. | |
| 2018/0098454 A1 | 4/2018 | Chen et al. | |
| 2019/0082828 A1* | 3/2019 | Chen | A47B 88/43 |
| 2019/0373758 A1* | 12/2019 | Chen | A47B 88/483 |
| 2021/0127827 A1* | 5/2021 | Chen | H05K 7/14 |

FOREIGN PATENT DOCUMENTS

| | | | |
|---|---|---|---|
| EP | 3576507 | * | 12/2019 |
| JP | 5454316 B2 | | 3/2014 |

* cited by examiner

SLIDE RAIL ASSEMBLY

BACKGROUND OF THE INVENTION

1. Field of the Invention

The present invention relates to a slide rail assembly, and more particularly, to a slide rail assembly with a locking device.

2. Description of the Prior Art

U.S. Pat. No. 6,644,481 B2 discloses an apparatus for rackmounting a chassis, which includes a mounting shelf and a sliding bracket. The mounting shelf is attached to a rack through at least one connector. The sliding bracket is configured to position the chassis in the rack through a flange. As shown in FIG. 1 of the patent, the flange is not movable relative to the sliding bracket, and the flange is configured to connect to the mounting shelf or the rack.

However, for different market requirements, it is important to develop various slide rail products with brackets.

SUMMARY OF THE INVENTION

The present invention relates to a slide rail assembly with a locking device.

According to an embodiment of the present invention, a slide rail assembly comprises a first rail, a bracket, a second rail and a locking device. The bracket is arranged on the first rail. The bracket has a locking part. The second rail is movable relative to the first rail from a retracted position to an extended position. The locking device is arranged on the second rail. The locking device comprises a locking base and a locking member. The locking base is configured to be operated relative to the second rail to be in one of an open state and a closed state. When the locking base is in the closed state, the locking member corresponds to the locking part of the bracket. When the locking base is in the open state, the locking member is away from the locking part of the bracket. When the second rail is located at the retracted position relative to the first rail with the locking base being in the closed state, the locking member is able to be fastened into the locking part of the bracket, so as to prevent the second rail from being moved relative to the first rail from the retracted position to the extended position.

According to another embodiment of the present invention, a slide rail assembly comprises a first rail, a bracket, a second rail and a locking device. The bracket is arranged on the first rail. The bracket comprises a fastening member and a locking part arranged on the fastening member. The second rail is movable relative to the first rail from a retracted position to an extended position. The locking device is arranged on the second rail. The locking device comprises a locking base and a locking member. The locking base is configured to be operated relative to the second rail to be in one of an open state and a closed state. When the locking base is in the closed state, the locking member corresponds to the locking part of the bracket. When the locking base is in the open state, the locking member is away from the locking part of the bracket. When the second rail is located at the retracted position relative to the first rail with the locking base being in the closed state, the locking base has a feature configured to abut against a front end part of the second rail or to shorten a gap between the locking base and the front end part of the second rail. When the second rail is located at the retracted position relative to the first rail with the locking base being in the closed state, the locking member is able to be fastened into the locking part of the bracket.

According to another embodiment of the present invention, a slide rail assembly comprises a first rail, a bracket, a second rail and a locking device. The bracket is arranged on the first rail. The bracket comprises a locking part. The second rail is movable relative to the first rail from a retracted position to an extended position. The second rail comprises a first wall, a second wall and a longitudinal wall connected between the first wall and the second wall of the second rail. The longitudinal wall of the second rail has a first side and a second side opposite to the first side. The locking device is arranged on the second rail. The locking device comprises a locking base and a locking member. The locking base is transversely movable relative to the longitudinal wall of the second rail between a first transverse position and a second transverse position. The locking base is configured to be operated relative to the second rail to be in one of an open state and a closed state. When the locking base is located at the second transverse position and in the closed state, a side part of the locking base is not extended beyond the second side of the longitudinal wall of the second rail. When the second rail is located at the retracted position relative to the first rail with the locking base being in the closed state, the locking member is able to be fastened into the locking part of the bracket.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
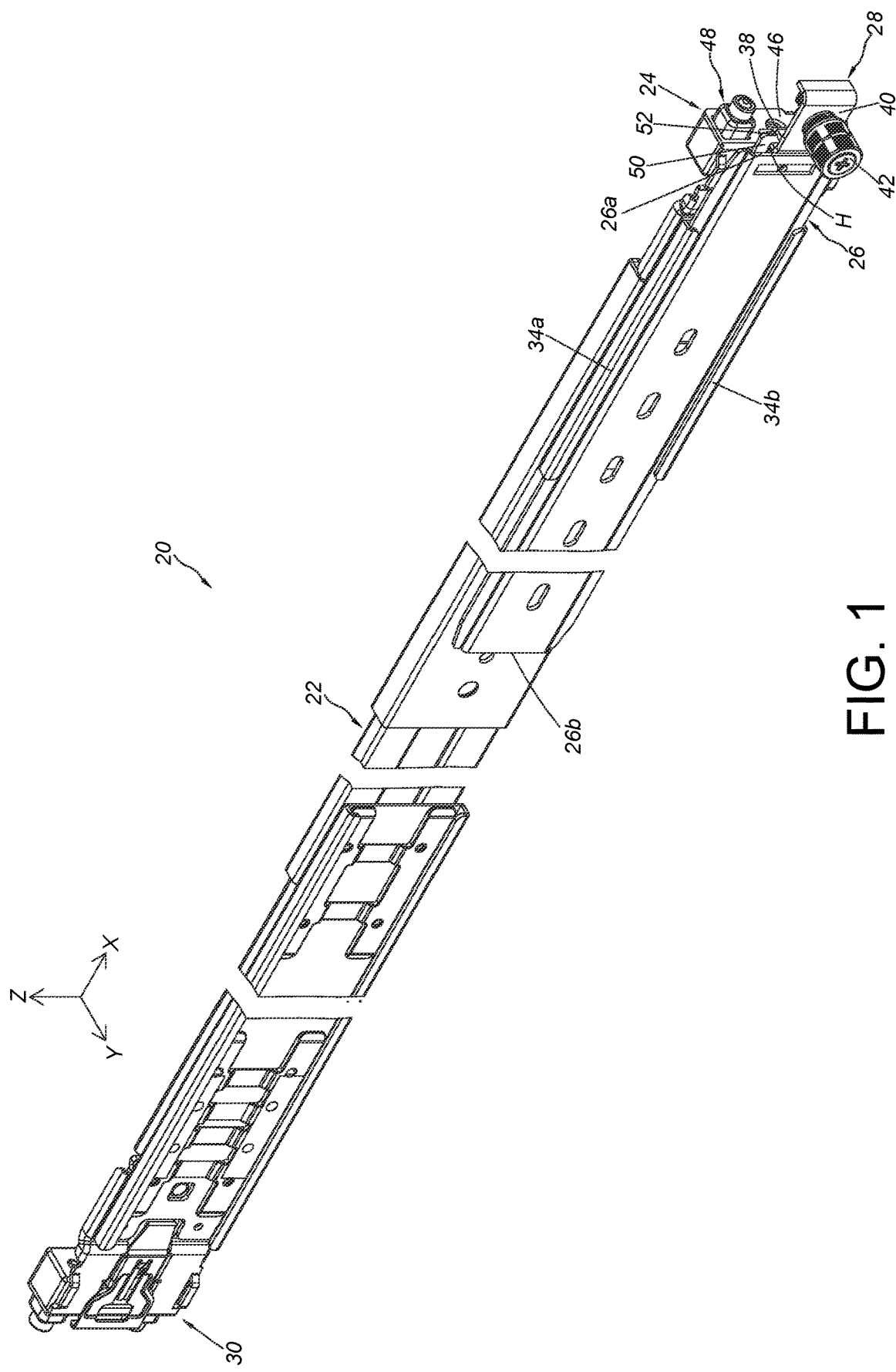
FIG. 1 is a diagram showing a slide rail assembly according to an embodiment of the present invention.
Figure 2:
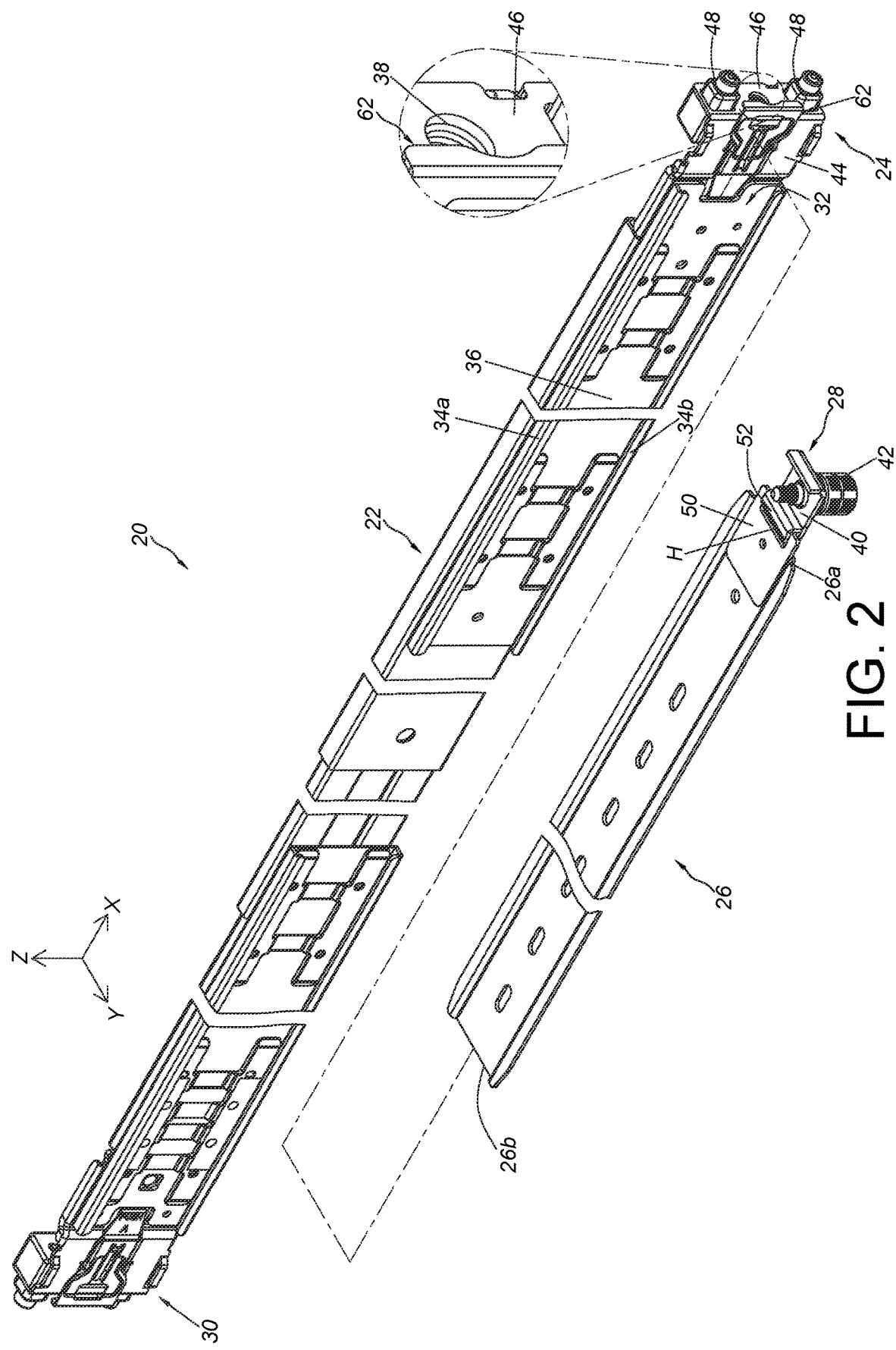
FIG. 2 is an exploded view of the slide rail assembly comprising a first rail and a second rail according to the embodiment of the present invention.

As shown in FIG. 1 and FIG. 2, a slide rail assembly 20 comprises a first rail 22, a bracket, a second rail 26 and a locking device 28 according to an embodiment of the present invention. The bracket can be a front bracket 24, but the present invention is not limited thereto. Preferably, the slide rail assembly 20 further comprises another bracket, such as a rear bracket 30.

The first rail has a first end part and a second end part away from the first end part, such as a front end part and a rear end part. The first rail 22 comprises a plurality of walls defining a passage 32 configured to movably mount the second rail 26. In the present embodiment, a predetermined portion of the first rail 22 is arranged with a first wall 34a, a second wall 34b and a longitudinal wall 36 connected between the first wall 34a and the second wall 34b. The passage 32 is defined by the first wall 34a, the second wall 34b and the longitudinal wall 36.

The front bracket 24 is arranged on the first rail 22, and the front bracket 24 has a locking part 38. Preferably, the front bracket 24 is arranged adjacent to the front end part of the first rail 22. On the other hand, the rear bracket 30 is arranged adjacent to the rear end part of the first rail 22. Preferably, one of the front bracket 24 and the rear bracket 30 is longitudinally adjustable relative to the first rail 22. Preferably, the front bracket 24 comprises a side plate 44 and an end plate 46 adjacent to the side plate 44. In the present embodiment, the end plate 46 is substantially perpendicularly connected to the side plate 44. Two mounting members 48 are arranged on the end plate 46, and the locking part 38 is located between the two mounting members 48.

The second rail 26 is longitudinally movable relative to the first rail 22. The second rail 26 has a first end part and a second end part away from the first end part, such as a front end part 26a and a rear end part 26b. Moreover, in the present embodiment, an X-axis direction is defined as a longitudinal direction (or a length direction or moving direction of the rail), a Y-axis direction is defined as a transverse direction (or a lateral direction of the rail), and a Z-axis direction is defined as vertical direction (or a height direction of the rail).

The locking device 28 is arranged adjacent to the second rail 26. The locking device 28 comprises a locking base 40 and a locking member 42.

Preferably, the locking device 28 is arranged adjacent to the front end part 26a of the second rail 26.

Preferably, a fixing base 50 is connected to an inner side of the front end part 26a of the second rail 26. When the second rail 26 is located at a retracted position, the fixing base 50 is extended beyond the end plate 46 of the front bracket 24 (as shown in FIG. 1). The fixing base 50 has a hole H (it also can be regarded that the second rail 26 has the hole H). The locking base 40 has a connecting section 52 passing through the hole H of the fixing base 50, in order to connect (such as movably connect) the locking base 40 to the fixing base 50. On the other hand, the locking member 42 is arranged on the locking base 40.

Figure 3:
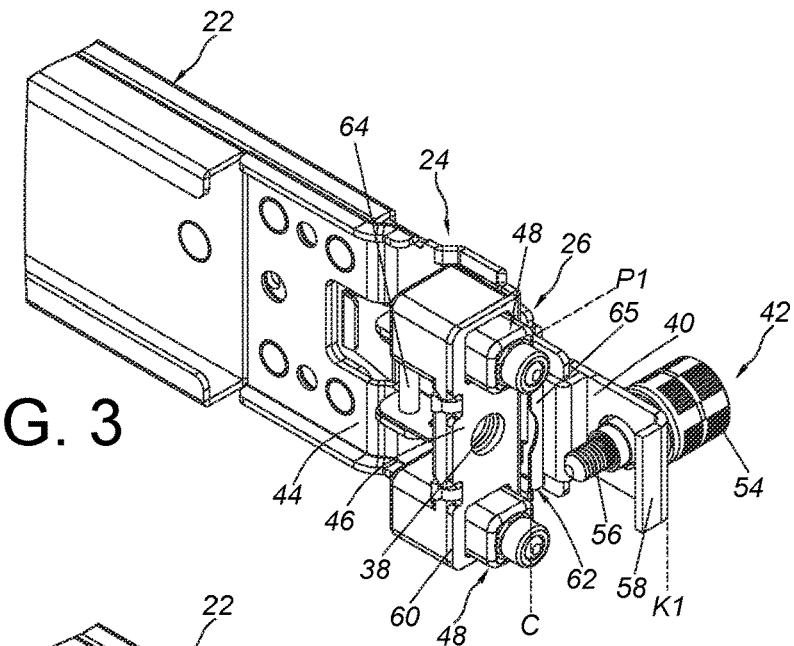
FIG. 3 is a partial view of a locking base of the slide rail assembly being in an open state relative to the second rail according to the embodiment of the present invention.
Figure 4:
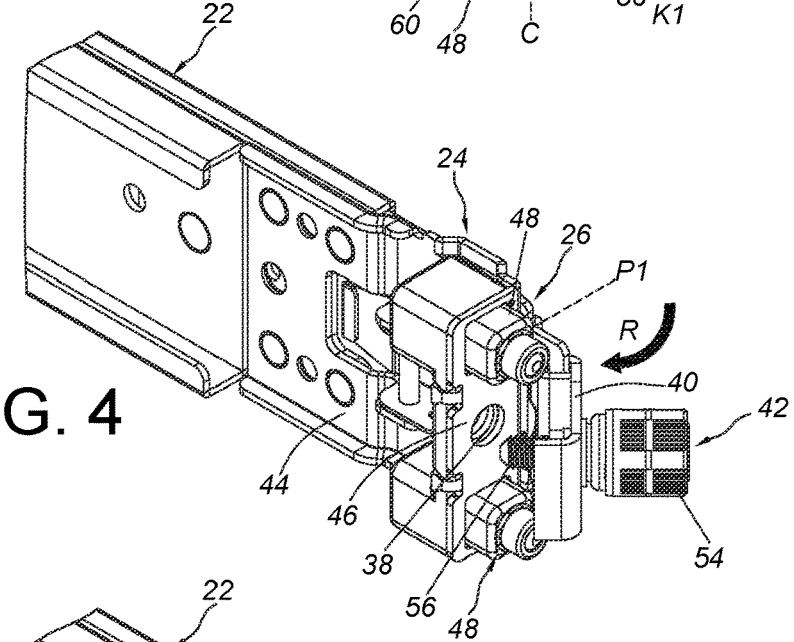
FIG. 4 is a partial view of the locking base of the slide rail assembly being closed relative to the second rail along a predetermined direction from the open state according to the embodiment of the present invention.
Figure 5:
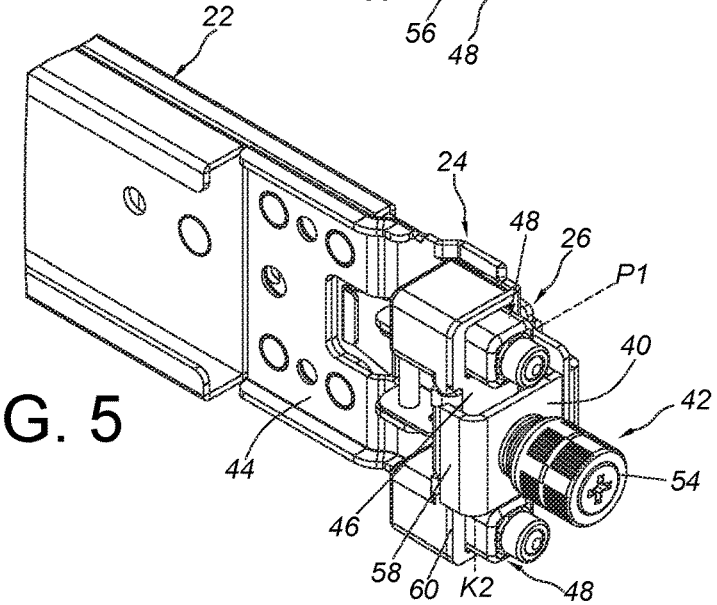
FIG. 5 is a partial view of the locking base of the slide rail assembly being in a closed state relative to the second rail according to the embodiment of the present invention.

As shown in FIG. 3 to FIG. 5, the locking base 40 is configured to be operated relative to the second rail 26 to be in one of an open state K1 (as shown in FIG. 3) and a closed state K2 (as shown in FIG. 5). In the present embodiment, the locking base 40 is configured to be rotated relative to the second rail 26 from the open state K1 to the closed state K2; or the locking base 40 is configured to be rotated relative to the second rail 26 from the closed state K2 to the open state K1.

When the locking base 40 is in the open state K1, the locking member 42 is away from (or misaligned with) the locking part 38 of the front bracket 24 (as shown in FIG. 3); when locking base 40 is in the closed state K2, the locking member 42 corresponds to (or is aligned with) the locking part 38 of the front bracket 24 (as shown in FIG. 5).

Preferably, the locking part 38 is a screw hole. The locking member 42 comprises an operating part 54 and a threaded part 56 connected to the operating part 54. The threaded part 56 and the locking part 38 have screwing structures matching each other.

Moreover, when the second rail 26 is located at a predetermined position, such as a retracted position P1, relative to the first rail 22, the locking base 40 can be operated to rotate in a predetermined direction R (as shown in FIG. 4) from the open state K1 (as shown in FIG. 3) to the closed state K2, such that the locking member 42 can be fastened into the locking part 38 of the front bracket 24 through the threaded part 56 to prevent the second rail 26 from being moved relative to the first rail 22 from the retracted position P1 (as shown in FIG. 5). That is, when the locking member 42 is fastened into the locking part 38 of the front bracket 24, the second rail 26 is fixed at the retracted position P1. Moreover, when the locking base 40 is in the closed state K2 and the locking member 42 corresponds to (or is aligned with) the locking part 38 of the front bracket 24, a user can apply a force to the operating part 54 by hand or by a tool (such as a screw driver) to rotate the locking member 42, so as to fasten the threaded part 56 into the locking part 38 of the front bracket 24 (as shown in FIG. 5).

Preferably, the locking base 40 has a bending section 58. When the locking base 40 is in the closed state K2, the bending section 58 of the locking base 40 is adjacent to a side edge 60 of the end plate 46 of the front bracket 24 (as shown in FIG. 5).

Preferably, the slide rail assembly 20 further comprises a fastening member 62 movably mounted to the front bracket 24 (as shown in FIG. 3). For example, the fastening member 62 is pivotally connected to the front bracket 24 through a shaft 64, such that the fastening member 62 is movable between a locking position C (as shown in FIG. 3) and an unlocking position (not shown in figures). When the fastening member 62 is located at the locking position C, a fastening part 65 of the fastening member 62 is in front of the end plate 46 of the front bracket 24. Preferably, the fastening member 62 can be held at the locking position C by an elastic force of an elastic part. Configuration of the fastening member 62 is well known to those skilled in the art, for simplification, no further illustration is provided.

Figure 6:
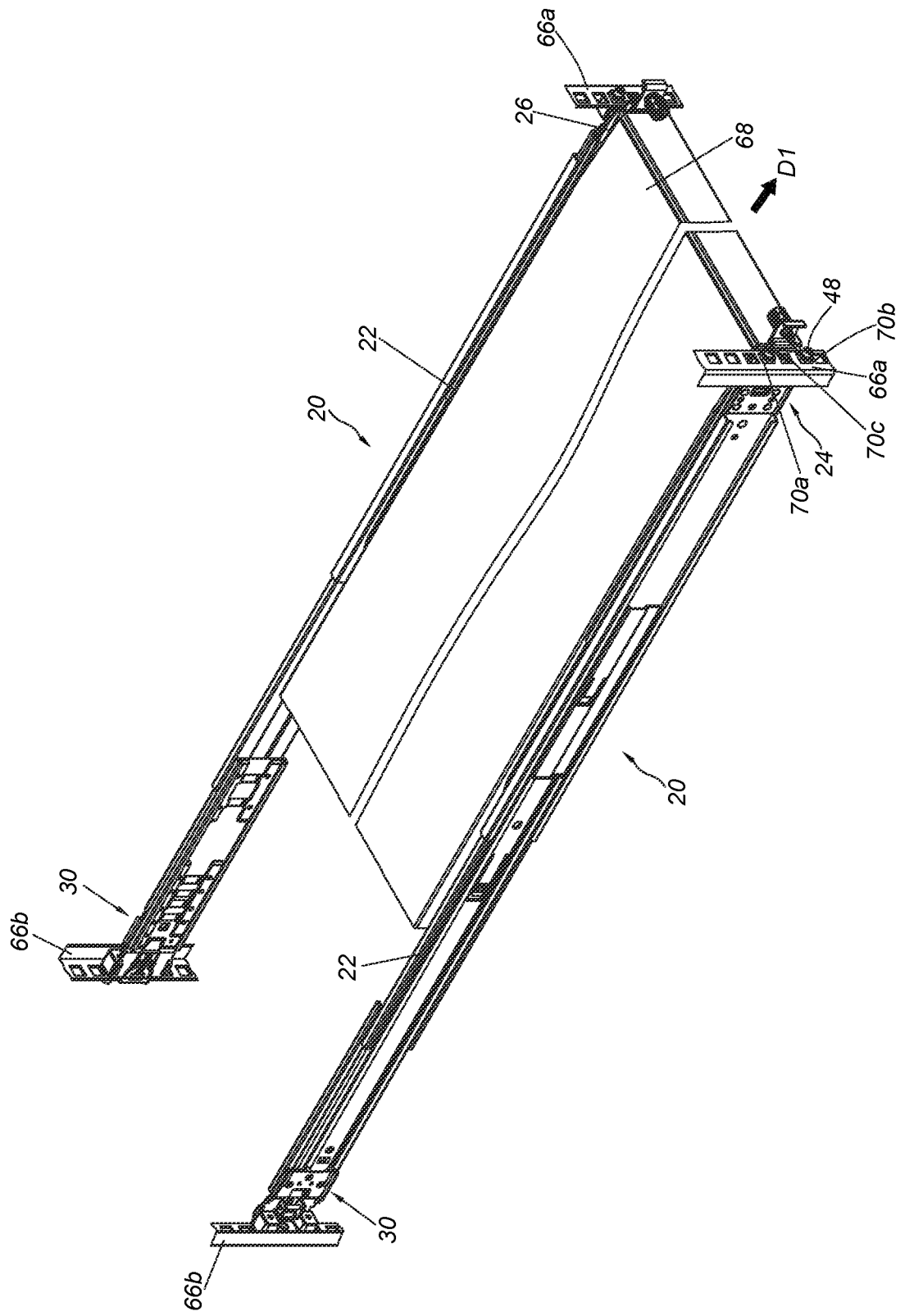
FIG. 6 is a diagram showing the slide rail assembly being applied to a rack with the second rail being located at a retracted position relative to the first rail according to the embodiment of the present invention.
Figure 7:
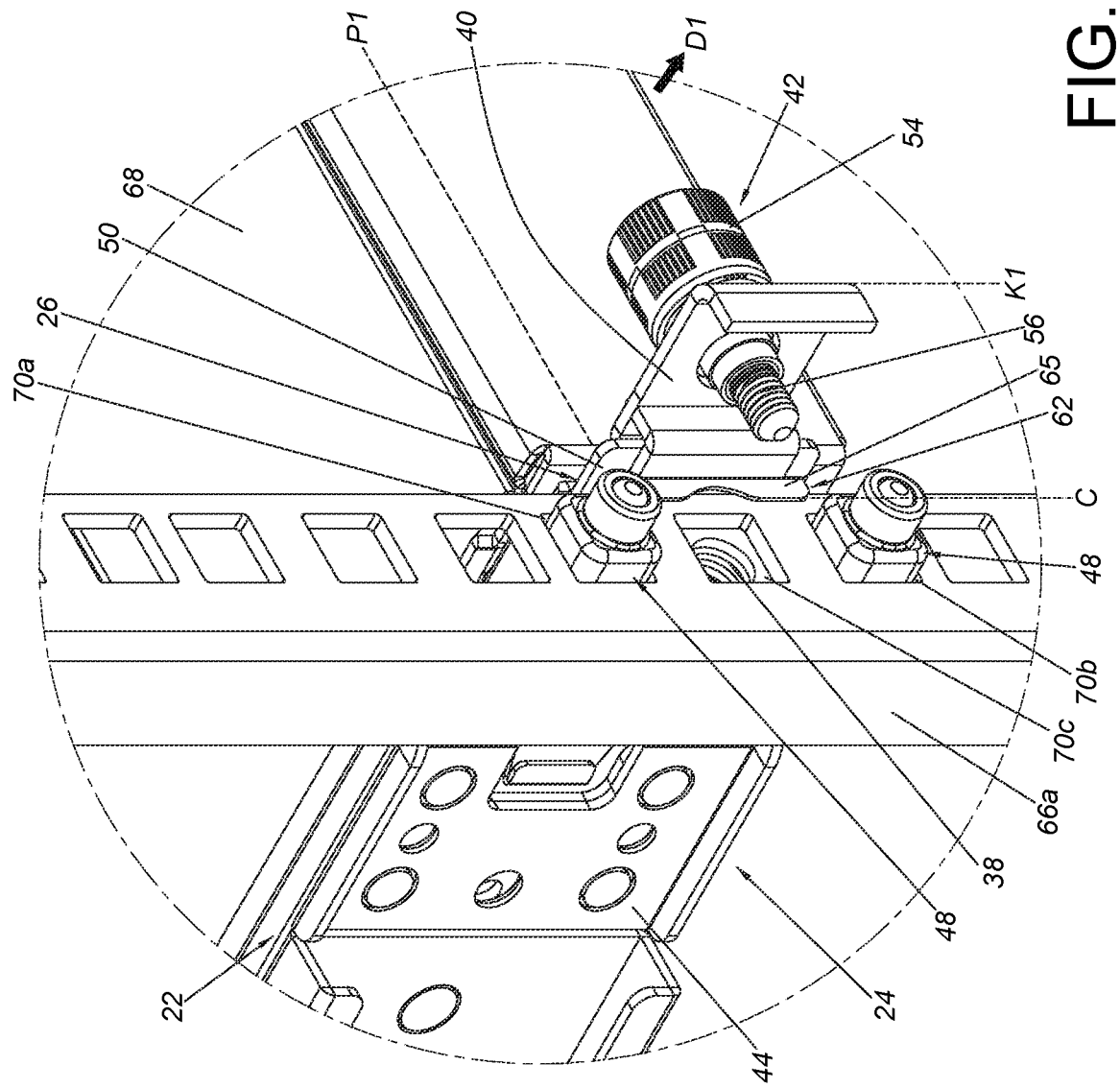
FIG. 7 is a diagram the slide rail assembly being applied to the rack with the second rail being located at the retracted position relative to the first rail and the locking base being not fastened to the rack according to the embodiment of the present invention.

As shown in FIG. 6 and FIG. 7, two slide rail assemblies 20 are mounted to a rack. Specifically, the rack comprises at least one pair of posts, such as a pair of front posts 66a and a pair of rear posts 66b. Each front post 66a and each rear post 66b are mounted with a corresponding slide rail assembly 20. The first rail 22 of the slide rail assembly 20 is mounted to the front post 66a and the rear post 66b respectively through the front bracket 24 and the rear bracket 30, and the second rail 26 is configured to carry a carried object 68, such as an electronic device. The second rail 26 is located at the retracted position P1 relative to the first rail 22. Arrangement of the front bracket 24 being mounted to the front post 66a is substantially identical to arrangement of the rear bracket 30 being mounted to the rear post 66b. For example, the front post 66a comprises a plurality of mounting holes (such as a first mounting hole 70a, a second mounting hole 70b and a third mounting hole 70c located between the first mounting hole 70a and the second mounting hole 70b). The front bracket 24 is configured to be mounted to the first mounting hole 70a and the second mounting hole 70b of the front post 66a through the two mounting members 48, and the fastening member 62 located at the locking position C is configured to lock a front edge of the front post 66a through the fastening part 65 (as shown in FIG. 7). The locking base 40 can be operated relative to the second rail 26 to be in the open state K1. In such state, the second rail 26 is movable relative to the first rail 22 along a first direction D1 from the retracted position P1.

Figure 8:
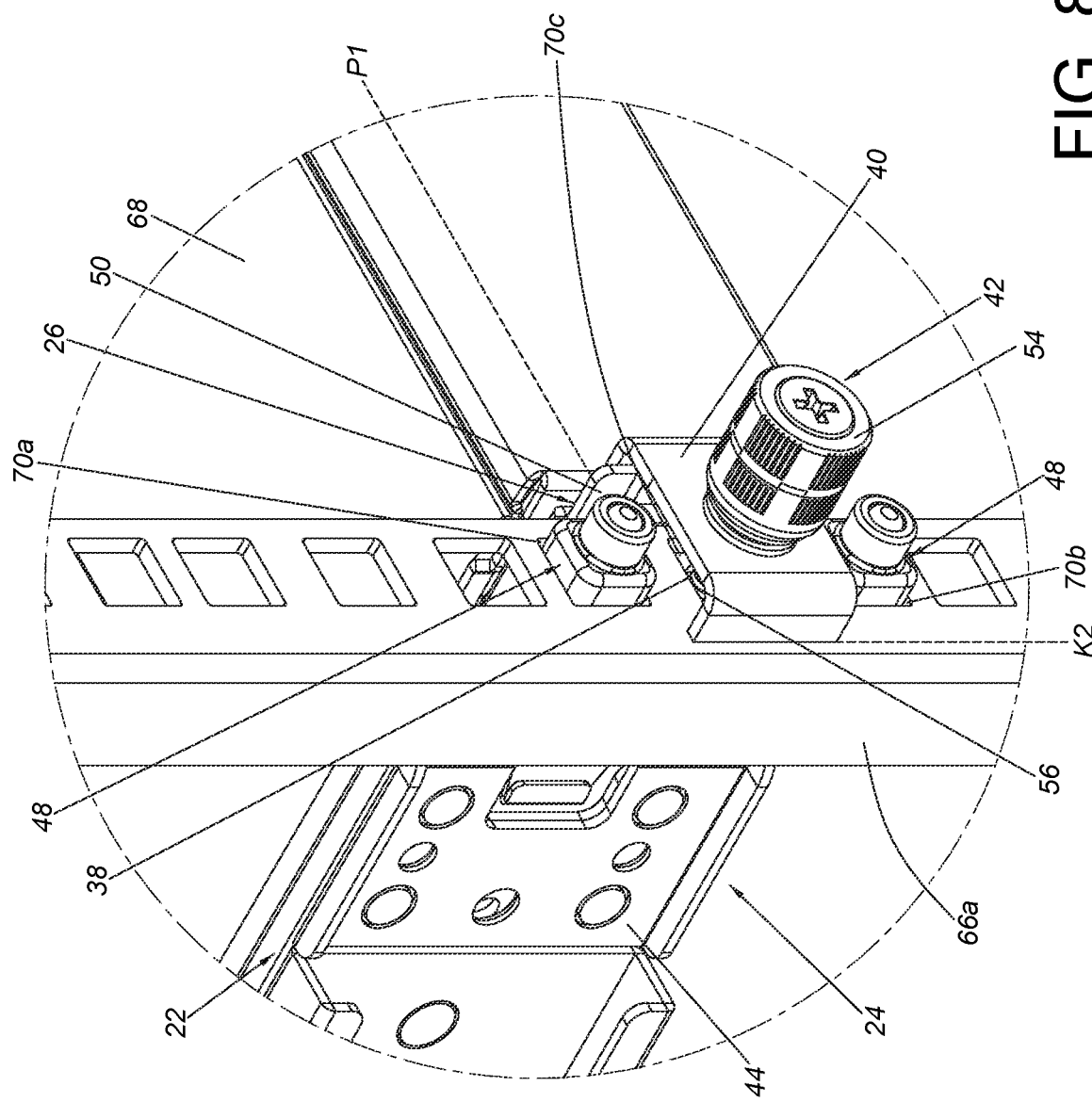
FIG. 8 is a diagram the slide rail assembly being applied to the rack with the second rail being located at the retracted position relative to the first rail and the locking base being fastened to the rack according to the embodiment of the present invention.

As shown in FIG. 8, when the second rail 26 is located at the retracted position P1 relative co the first rail 22, the locking base 40 can be operated to be in the closed state K2, such that the threaded part 56 of the locking member 42 can be fastened into the locking part 38 of the front bracket 24 in order to hold the carried object 68 in the rack without being freely moved outside the rack. Moreover, once the locking base 40 is operated relative to the second rail 26 to be in the closed state K2 with the threaded part 56 being fastened into the locking part 38 of the front bracket 24, the second rail 26 is prevented from being moved relative to the first rail 22 from the retracted position P1 along the first direction D1. That is, the carried object 68 is fixed at the retracted position P1.

Figure 9:
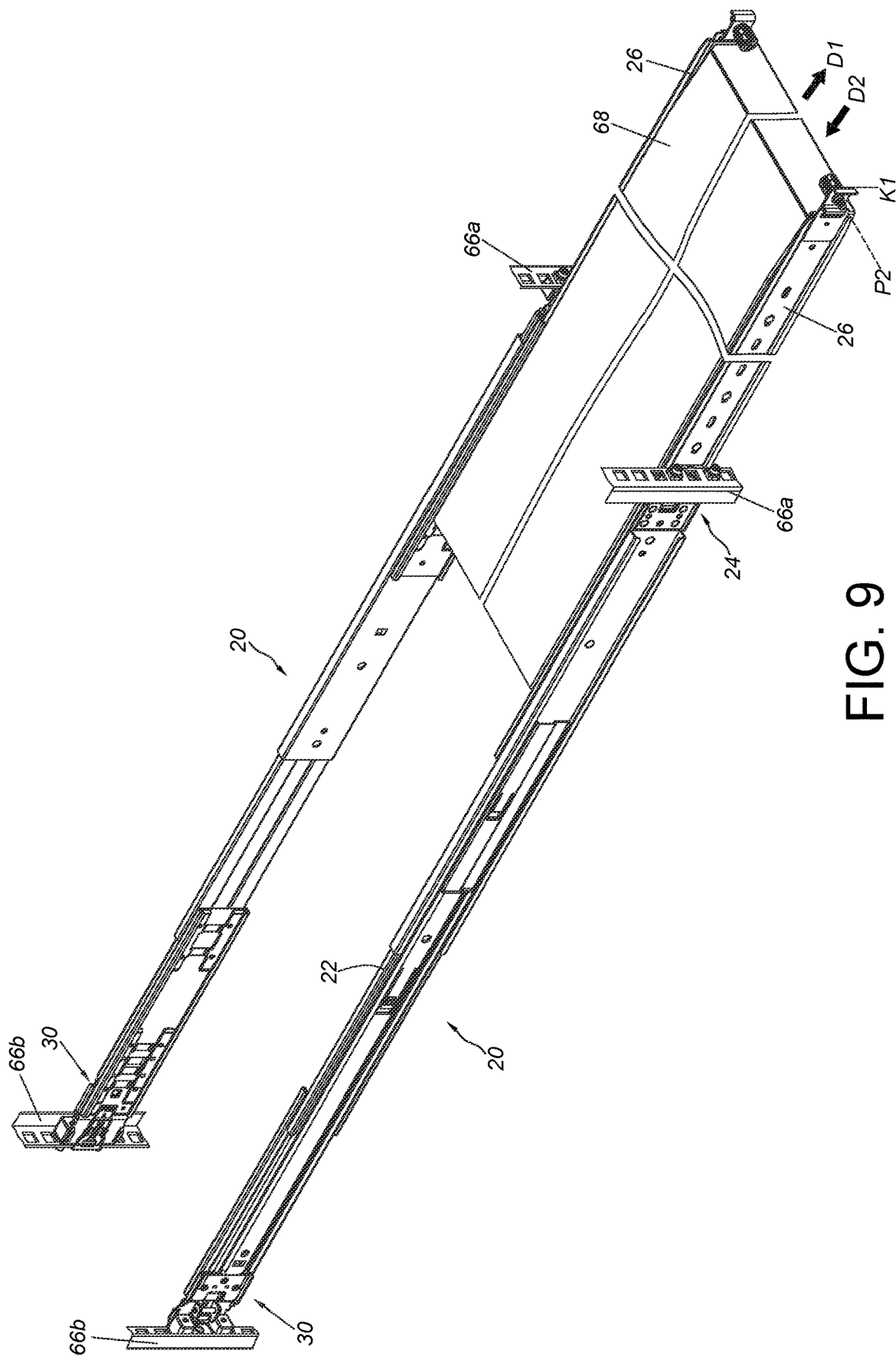
FIG. 9 is a diagram the slide rail assembly being applied to the rack with the second rail being located at an extended position relative to the first rail according to the embodiment of the present invention.

As shown in FIG. 9, when the locking base 40 is no longer in the closed state K2 relative to the second rail 26 (such as in the open state K1), the second rail 26 can be moved relative to the first rail 22 along the first direction D1 from the retracted position P1 to an extended position P2 to be located outside the rack. Moreover, the second rail 26 can be moved relative to the first rail 22 along a second direction D2 opposite to the first direction D1 from the extended position P2 to the retracted position P1 to return into the rack.

Figure 10:
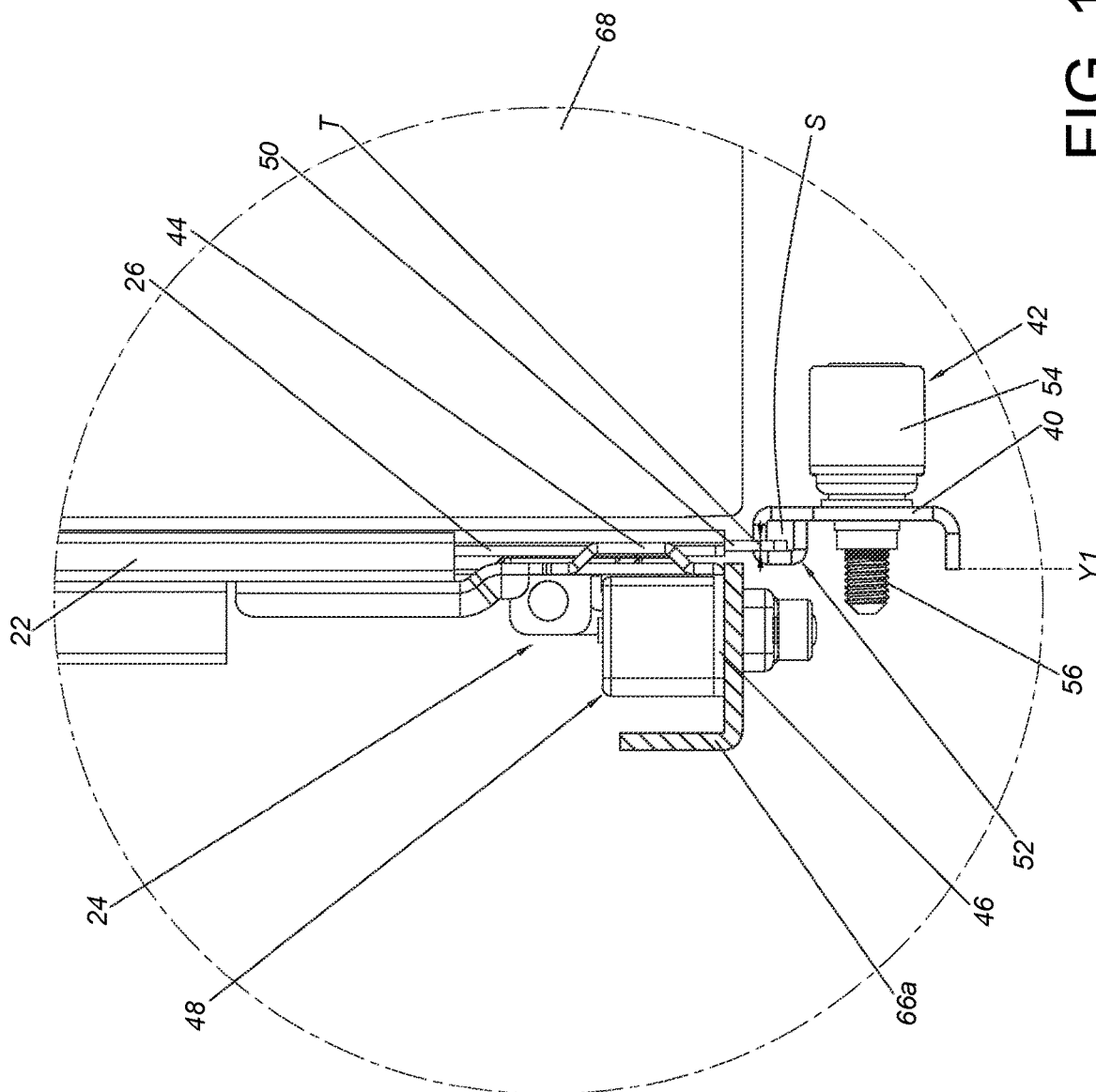
FIG. 10 is a partial view of the locking base of the slide rail assembly being located at a first transverse position relative to the second rail according to the embodiment of the present invention.
Figure 11:
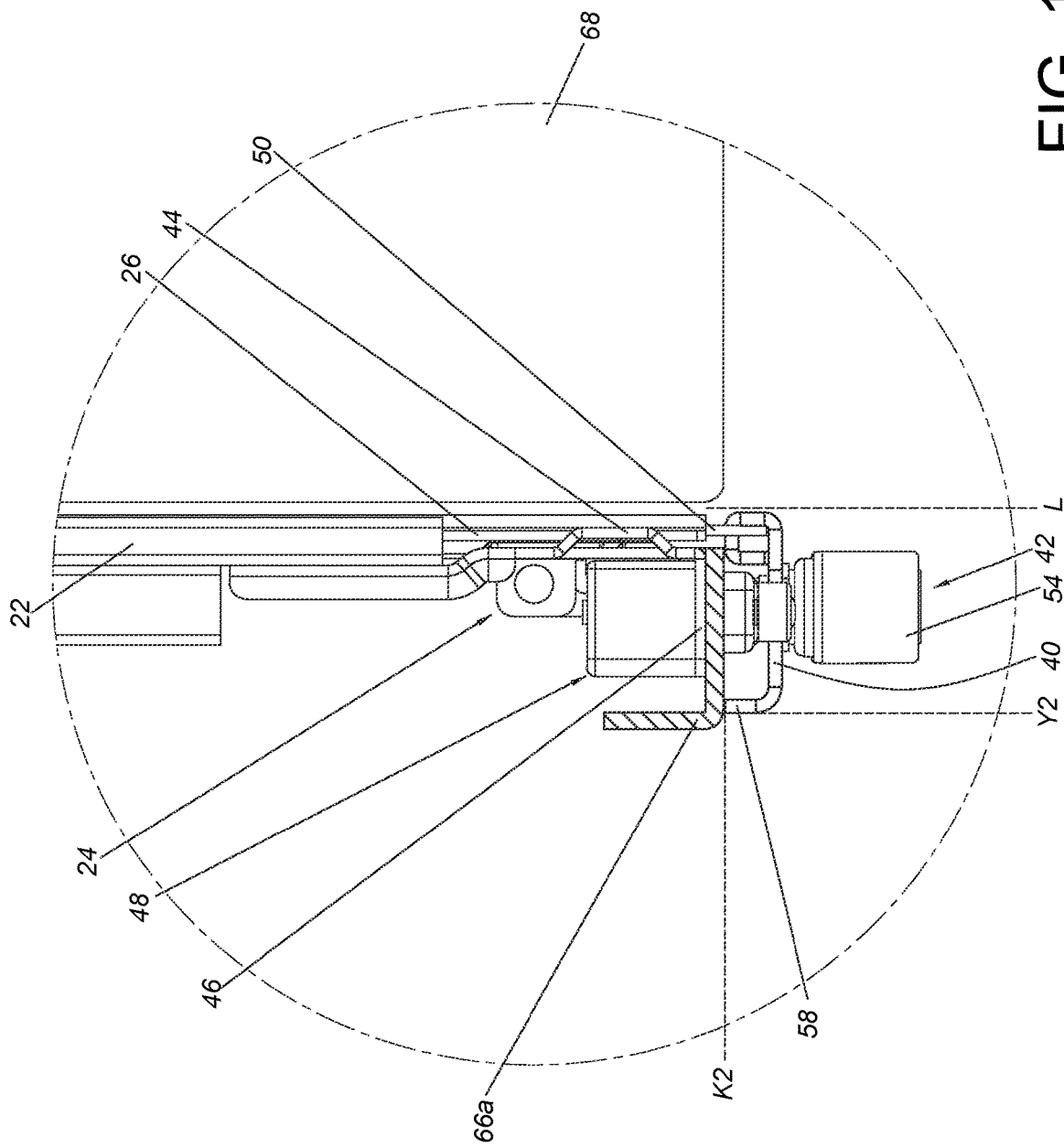
FIG. 11 is a partial view of the locking base of the slide rail assembly being located at a second transverse position relative to the second rail according to the embodiment of the present invention.

Please refer to FIG. 10 and FIG. 11, the fastening member 62 is omitted in the figures. The fixing base 50 has a predetermined thickness T (as shown in FIG. 10), and the connecting section 52 of the locking base 40 defines a bounded connecting space S. An internal width of the connecting space S is greater than the predetermined thickness T, to allow the locking base 40 to be transversely adjustable relative to the fixing base 50 of the second rail 26. For example, the locking base 40 can be transversely adjusted to move from a first transverse position Y1 (as shown in FIG. 10) to a second transverse position Y2 (as shown in FIG. 11).

Preferably, when the locking base 40 is located at the second transverse position Y2 to be in the closed state K2 with the locking member 42 being fastened into the locking part 38 of the front bracket 24 (as shown in FIG. 11), one lateral side of the locking base 40 and one lateral side of the second rail 26 are substantially located on a same longitudinal plane L. Such arrangement has an advantage in that the locking base 40 is prevented from blocking in front of the carried object 68 when the second rail 26 is located at the retracted position P1 relative to the first rail 22. For example, the locking base 40 is prevented from blocking an electronic connector, a cable, a warning light or a related sign arranged in front of the carried object 68, so as to allow an operator to easily perform related maintenance operation on the carried object 68 or the rails. Moreover, the locking member 42 can be easily aligned with or fastened into the locking part 38 of the front bracket 24 when the locking base 40 is located at the second transverse position Y2. Preferably, the bending section 58 of the locking base 40 is configured to correspondingly abut against a front surface (as shown in FIG. 11) of the post (such as the front post 66a) to improve fastening effect for mounting the front bracket 24 to the post.

Figure 12:
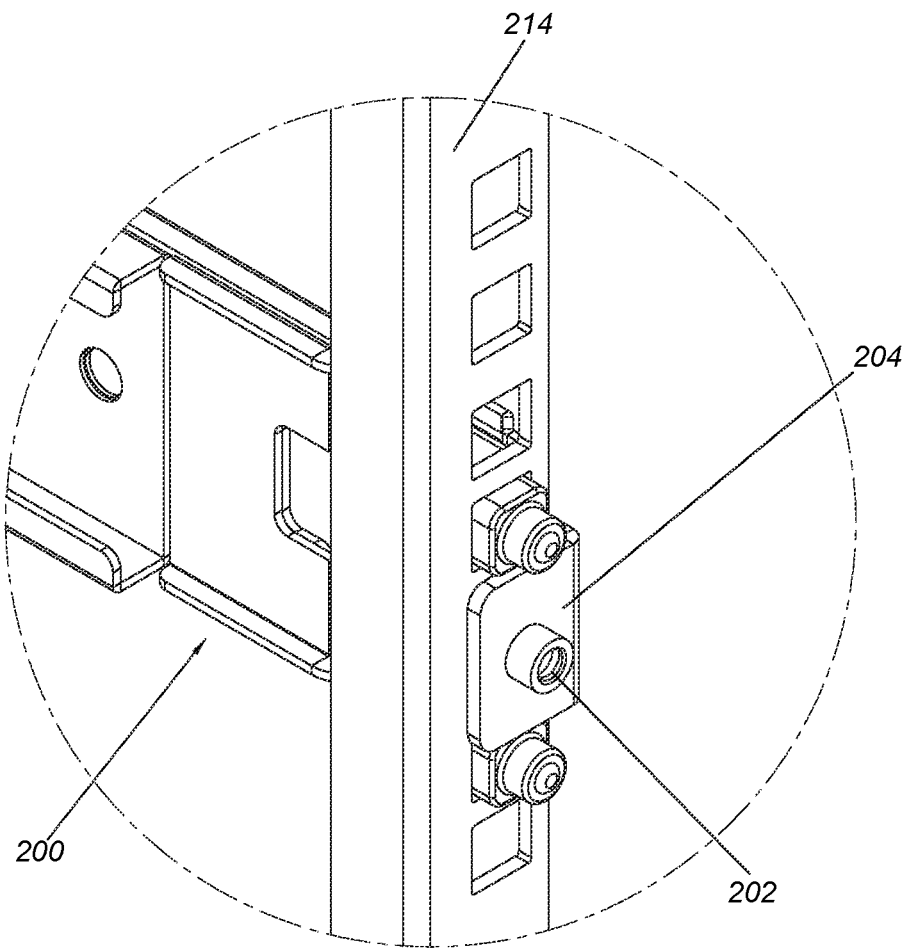
FIG. 12 is a diagram showing a locking part of a front bracket being arranged on a fastening member according to another embodiment of the present invention.
Figure 13:
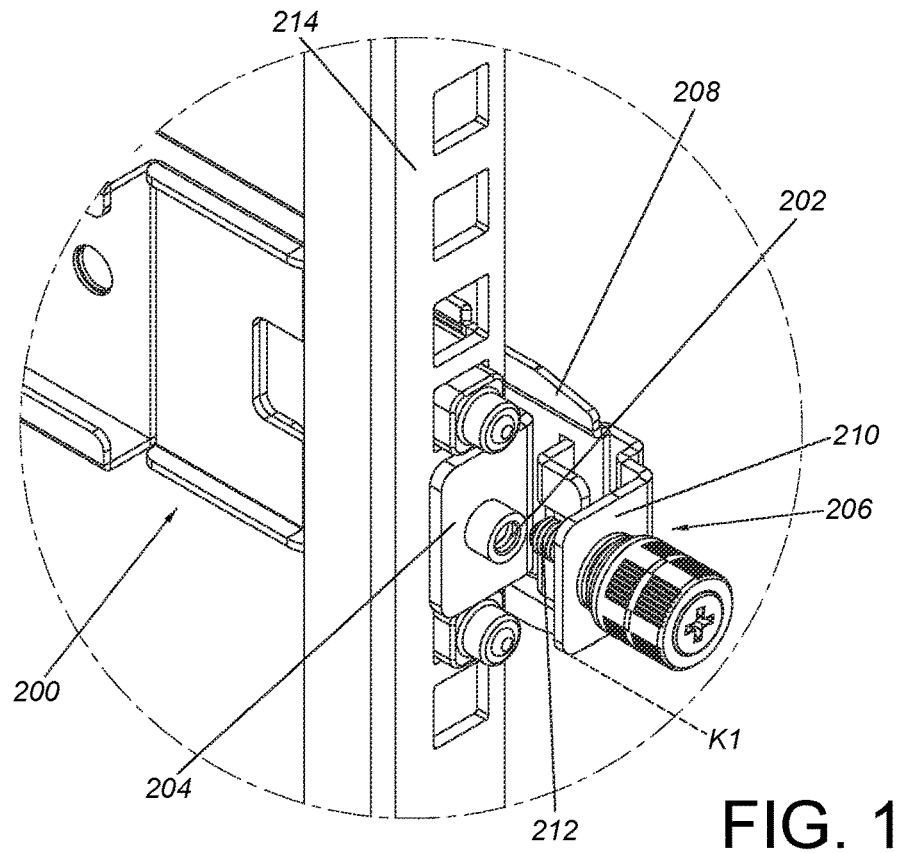
FIG. 13 is a diagram showing a locking device being arranged on a second rail while a locking base is in an open state and a locking member is away from (not corresponding to) the locking part according to the embodiment of FIG. 12 of the pre at invention.
Figure 14:
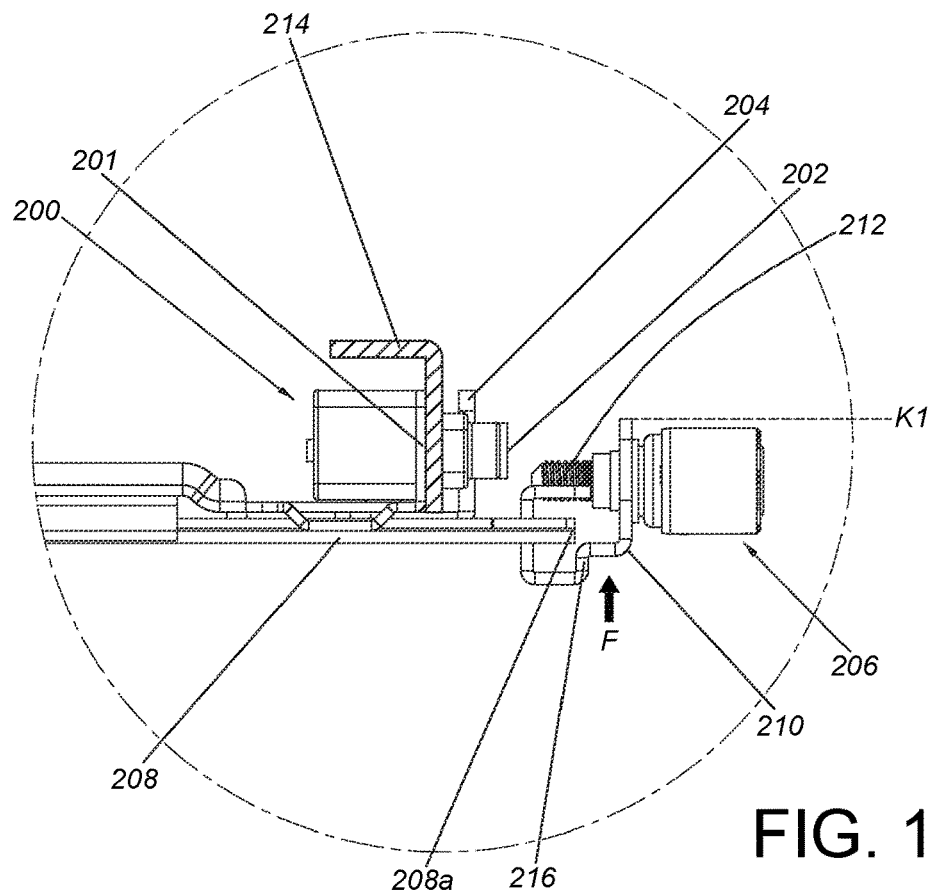
FIG. 14 is a top view of FIG. 13.

FIG. 12 to FIG. 14 show another embodiment of the present invention. Most arrangements in the present embodiment are substantially identical or similar to those in the aforementioned embodiment. One main difference is that the locking part 202 of the front racket 200 is arranged on the fastening part of the fastening member 204, and another one main difference is that the locking device 206 is arranged on the second rail 208. In FIG. 13 and FIG. 14, the locking base 210 is in the open state K1 and the locking-member 212 is away from (not corresponding to) the locking part 202, On the other hand, as shown in figures, when the front bracket 200 is mounted to a post 214, the locking dart 202 is located in front of the end plate 2017 or the post 214. In the aforementioned embodiment as shown in FIG. 7, the locking part 38 is located behind the front post 66a when the front bracket 24 is mounter to the front Post 66a, such that the locking member 42 in the aforementioned embodiment is farther from the locking part 38. However, in the present embodiment, the locking part 202 is moved forward to be located in front of the end plate 201 or the post 214, such that a distance between the threaded part of the locking member 212 and the locking part 202 is reduced.

Figure 15:
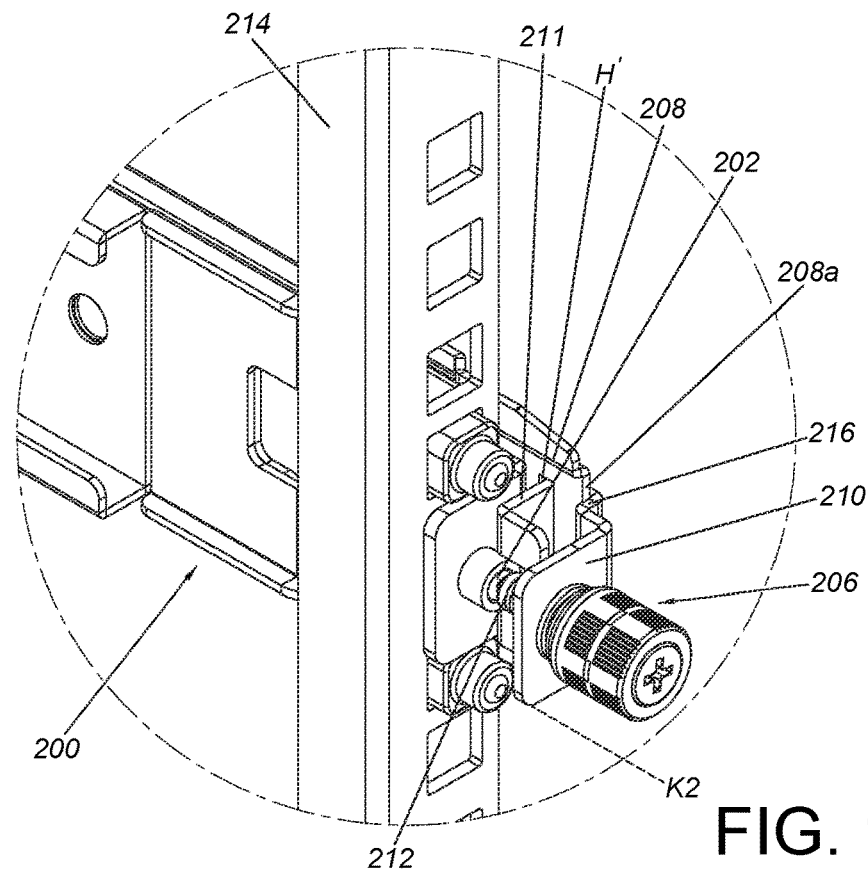
FIG. 15 is a diagram showing the locking device being arranged on the second rail while the locking base is in a closed state and the locking member corresponds to (but not fastened to) the locking part according to the embodiment of FIG. 12 of the present invention.
Figure 16:
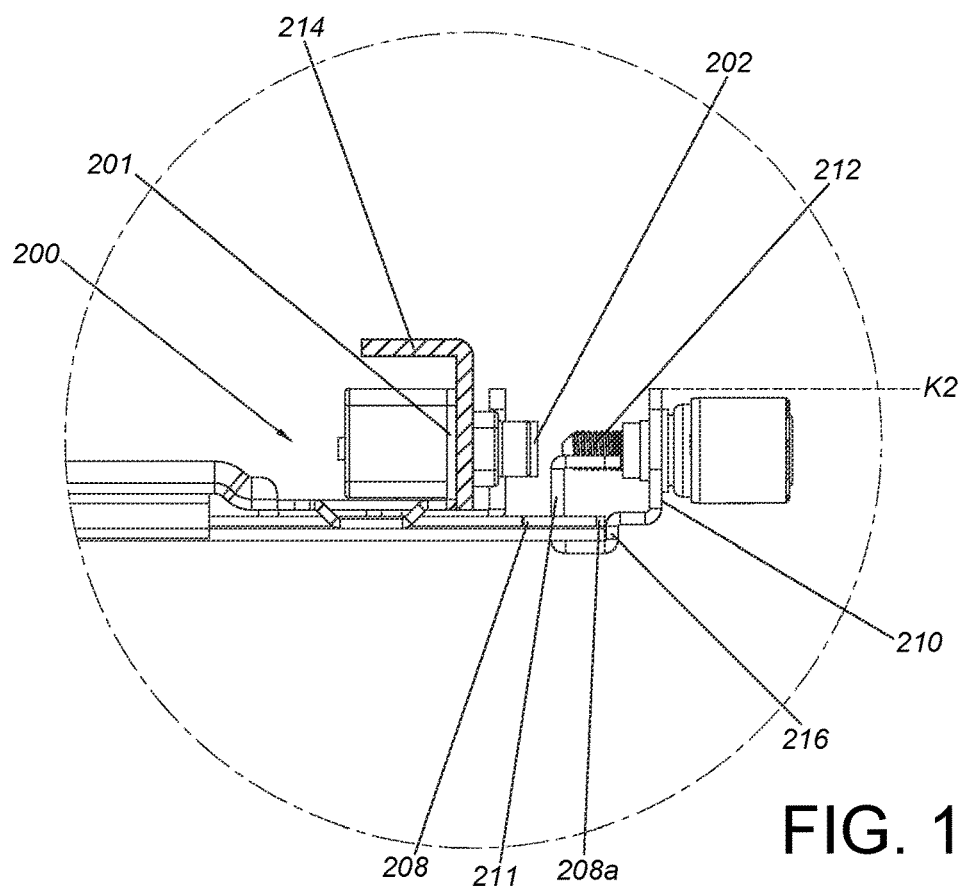
FIG. 16 is a top view of FIG. 15.
Figure 17:
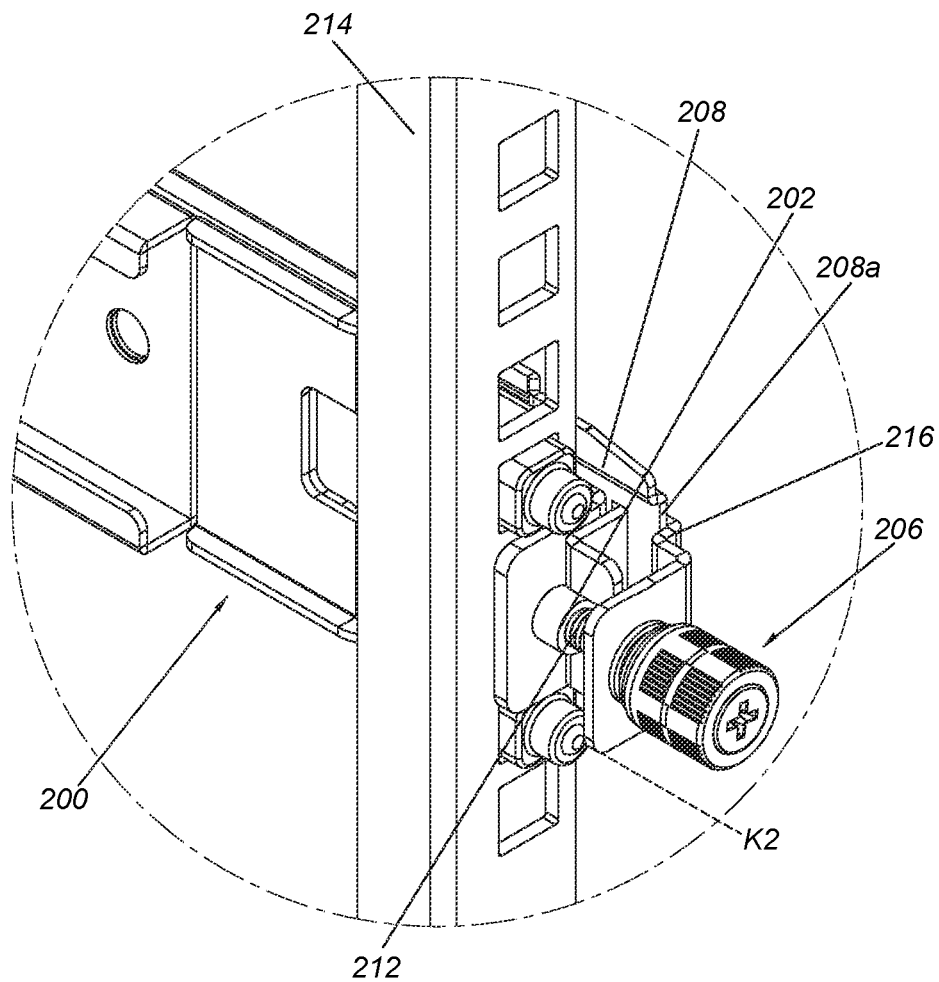
FIG. 17 is a diagram showing the locking member corresponding to and being fastening to the locking part of FIG. 15.

If the user is going to lock the locking member 212 of the locking device 206, the user can manually operate the locking base 210, such as applying an external force F (as shown in FIG. 14) to push the locking base 210 to move transversely from the open state K1 to the closed state K2, so that the threaded part of the locking member 212 corresponds to the locking part 202 (as shown in FIG. 15 and FIG. 16) in order to fasten the locking member 212 to the locking part 202 (as shown in FIG. 1). Preferably, the connecting section 211 of the locking base 210 passes through a hole H' of the second rail 208 (as shown in FIG. 15), and the locking base 210 is provided with a feature 216 (such as a bending part). When the locking member 212 is fastened to the locking part 202 or corresponds to the locking part 202 (without being fastened into the locking part 202), the feature 216 of the locking base 210 is configured to abut against the front end part 208a of the second rail 208, and the connecting section 211 of the locking base 210 is configured to abut against an inner wall of the hole H' of the second rail 208, so as to block the locking base 210 from moving along the longitudinal direction. Or, even if the locking base 210 does not abut against the second rail 208, a gap along the longitudinal direction between the locking base 210 and the front end part 208a of the second rail 208 can be reduced through the feature 216. As such, when the second rail 208 is extended and moved relative to the front bracket 200, the locking base 210 is prevented from being longitudinally moved relative to the second rail 208 due to the gap (longitudinal gap) between the locking base 210 and the second rail 208.

Figure 18:
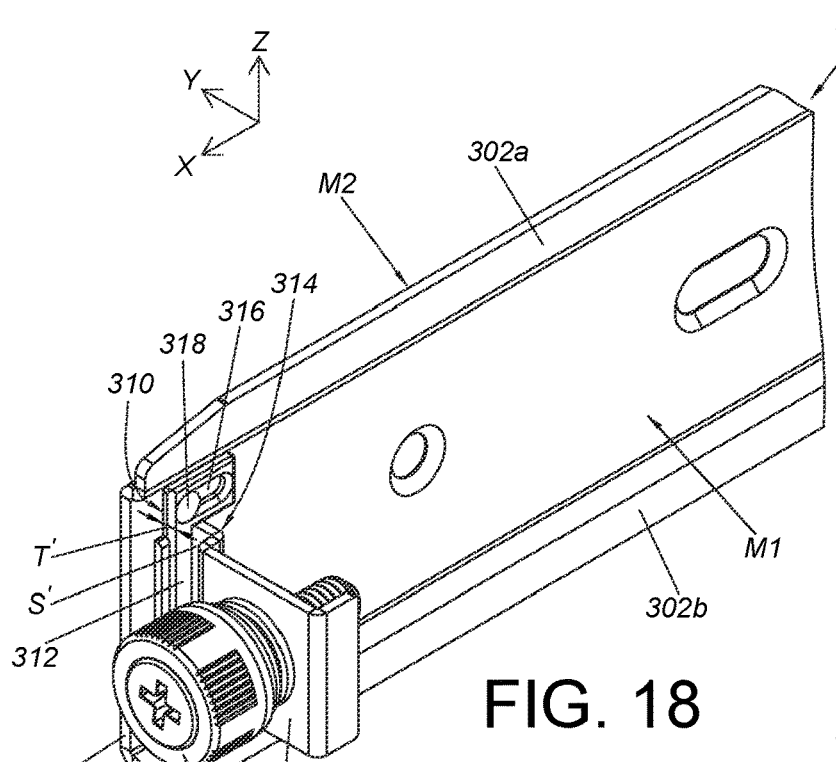
FIG. 18 is a diagram showing a second rail and a locking device according to another embodiment of the present invention.
Figure 19:
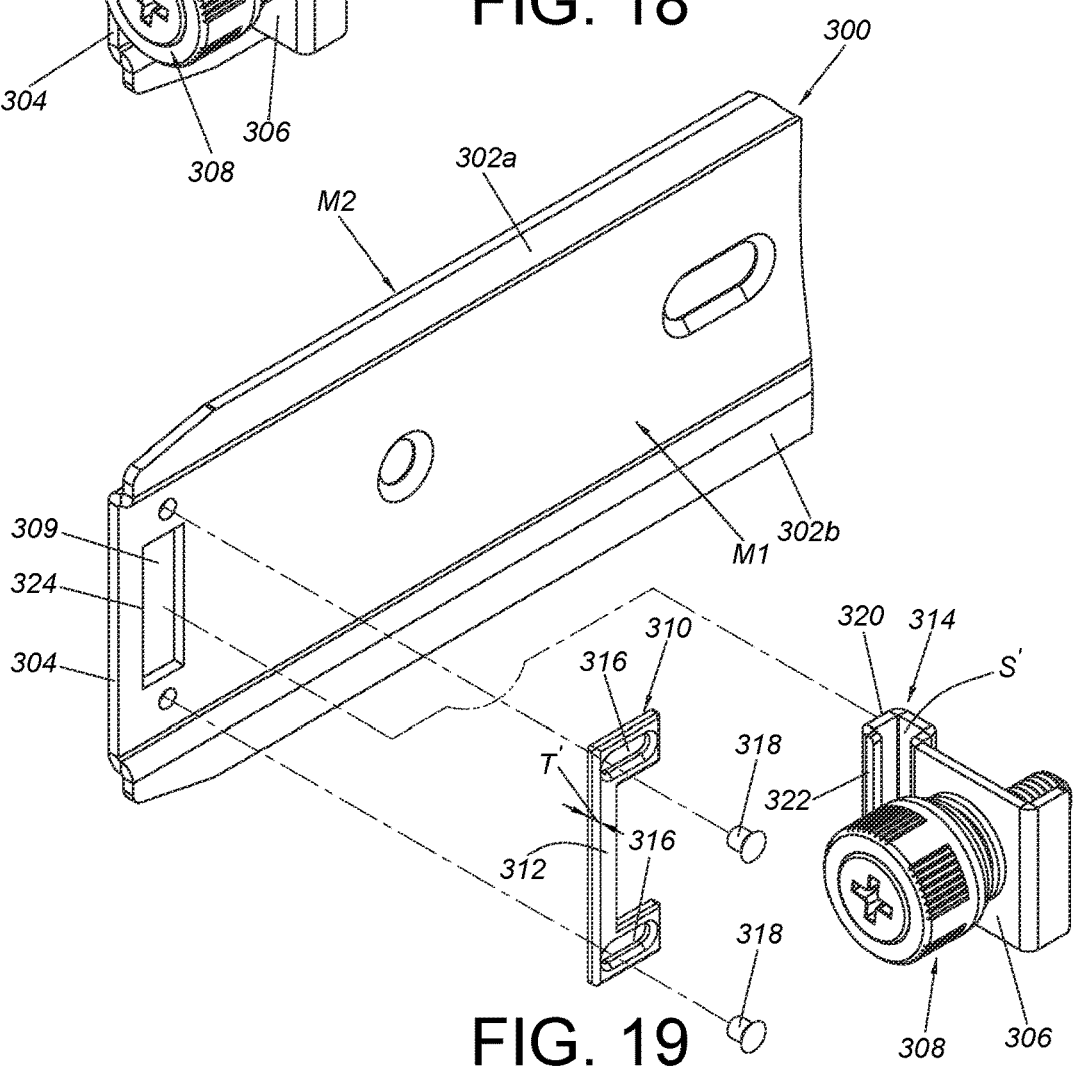
FIG. 19 is an exploded view of the second rail and the locking device according to the embodiment of FIG. 18 of the present invention.

FIG. 18 and FIG. 19 show another embodiment of the present invention. Most arrangements in the present embodiment are substantially identical or similar to those in the aforementioned embodiments. A main difference is in structural arrangement between the second rail and the locking device. Specifically, the second rail 300 comprises a first wall 302a, a second wall 302b and a longitudinal wall 304 connected between the first wall 302a and the second wall 302b. The longitudinal wall 304 of the second rail 300 has a first side M1 and a second side M2 opposite to the first side M1. On the other hand, the locking base 306 of the locking device is movably mounted to the second rail 300, and the locking member 308 is arranged on the locking base 306.

Preferably, the longitudinal wall 304 of the second rail 300 is formed with a predetermined space 309 communicated with the first side M1 and the second side M2, and the locking base 306 is transversely movable relative to the longitudinal wall 304 of the second rail 300 through the predetermined space 309. The predetermined space 309 is a hole, but the present invention is not limited thereto.

Preferably, the slide rail assembly further comprises an auxiliary member 310 movably mounted to the first side M1 of the longitudinal wall 304 of the second rail 300. The auxiliary member 310 has a supporting part 312 adjacent to the predetermined space 309, and the supporting part 312 of the auxiliary member 310 has a predetermined thickness T'. On the other hand, the locking base 306 has a connecting section 314. The connecting section 314 of the locking base 306 defines a bounded connecting space S' configured to accommodate the supporting part 312 of the auxiliary member 310. An internal width of the connecting space 3' is greater than the predetermined thickness T', to allow the locking base 306 to be transversely adjustable relative to the auxiliary member 310 (or the longitudinal wall 304 of the second rail 300).

Preferably, the connecting section 314 of the locking base 306 is located at position corresponding to the predetermined space 309 of the longitudinal wall 304 of the second rail 300.

Preferably, the auxiliary member 310 and the longitudinal wall 304 of the second rail 300 are longitudinally movable relative to each other within a limited range through arrangement of a first connecting feature 316 and a second connecting feature 318. In the present embodiment, the auxiliary member 310 has the first connecting feature 316, and the first connecting feature 316 is a bounded longitudinal feature (such as a hole or a groove). On the other hand, the second connecting feature 318 is a protrusion (such as a pin, a rivet or a bolt) configured to be inserted into a portion of the longitudinal feature and connected to the first side M1 of the longitudinal wall 304 of the second rail 300, so as to mount the auxiliary member 310 to the second rail 300.

Figure 20:
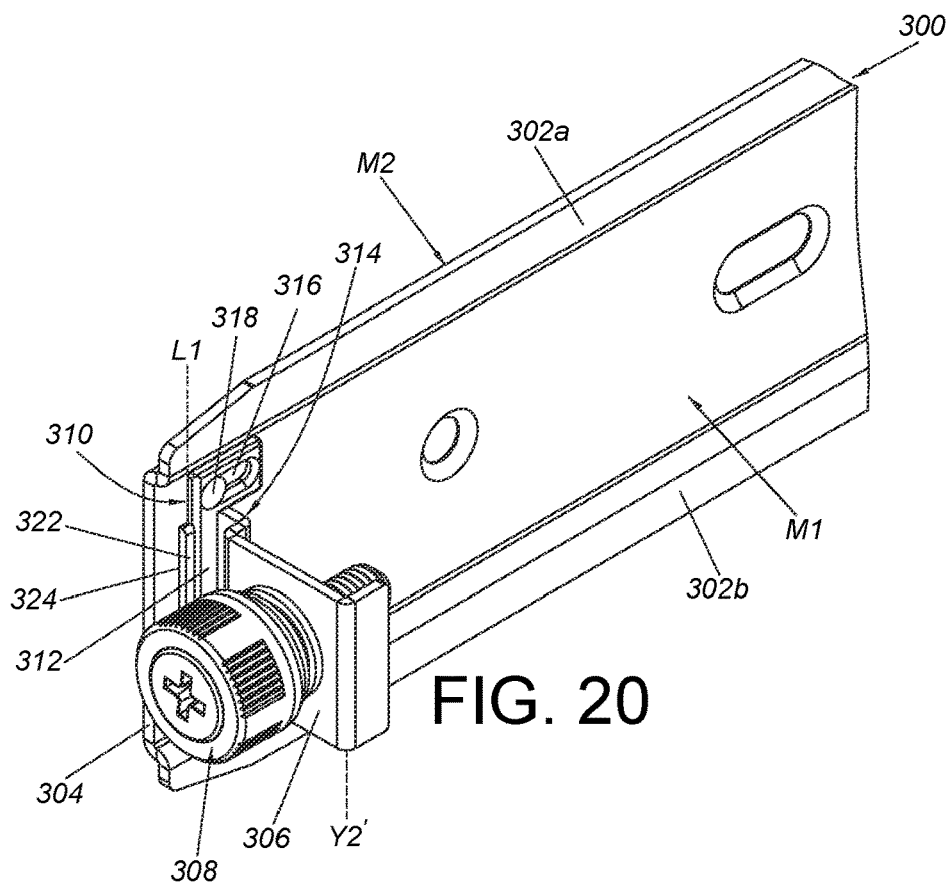
FIG. 20 is a diagram showing a locking base being located at a second transverse position relative to the second rail from a viewing angle according to the embodiment of FIG. 18 of the present invention.
Figure 21:
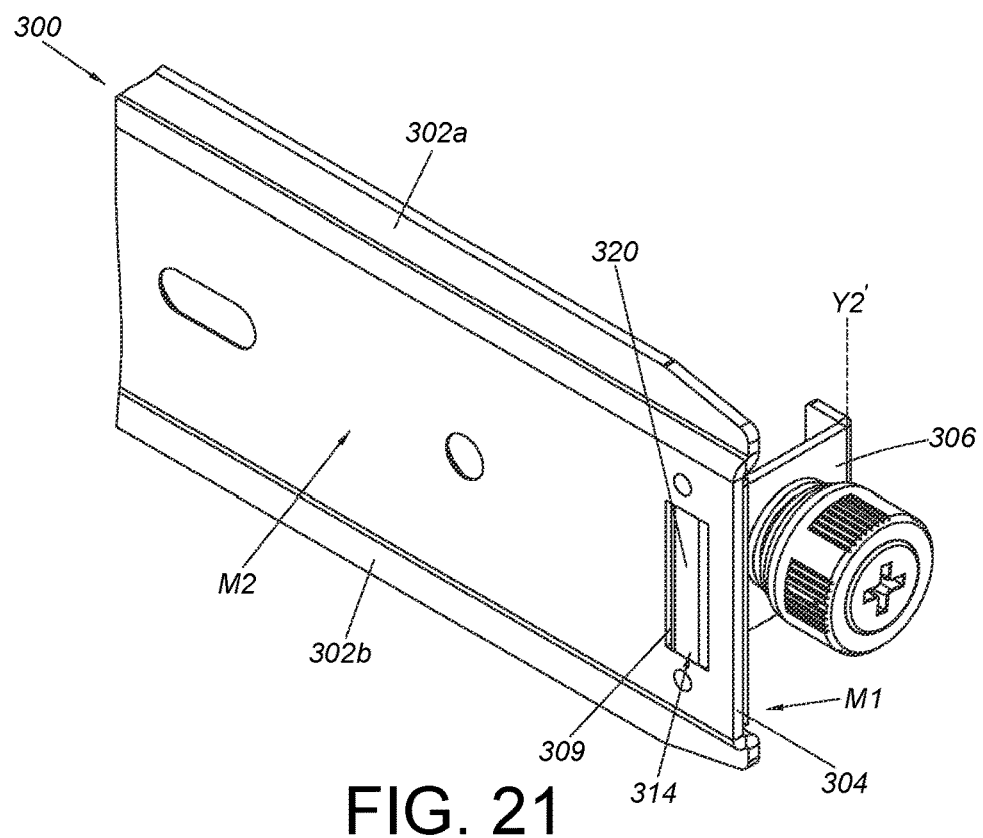
FIG. 21 is a diagram showing the locking base being located at the second transverse position relative to the second rail from another viewing angle according to the embodiment of FIG. 18 of the present invention.

As shown in FIG. 20 and FIG. 21, the locking base 306 is located at a second transverse position Y2' relative to the longitudinal wall 304 of the second rail 300, and the locking base 306 is in the closed state relative to the second rail 300. On the other hand, the auxiliary member 310 is located at a first longitudinal position L1 relative to the longitudinal wall 304 of the second rail 300 (as shown in FIG. 20). When the locking base 306 is located at the second transverse position Y2' and in the closed state, a side part 320 of the locking base 306 is not extended beyond the second side M2 of the longitudinal wall 304 of the second rail 300 (as shown in FIG. 21). In the present embodiment, the side Part 320 of the connecting section 314 of the locking base 306 corresponds to the predetermined space 309 of the longitudinal wall 304 of the second rail 300, and the side part 320 of the connecting section 314 of the locking base 306 is not extended beyond the second side M2 of the longitudinal wall 304 of the second rail 300 (as shown in FIG. 21), but the present invention is not limited thereto.

Preferably, when the locking base 306 is located at the second transverse position Y2', a bending feature 322 of the connecting section 314 of the locking base 306 and an edge wall 324 of the predetermined space 309 of the longitudinal wall 304 of the second rail 300 are configured to block each other, in order to hold the locking base 306 in the closed state (as shown in FIG. 20), such that the locking base 306 is prevented from being moved from the closed state to the open state.

Figure 22:
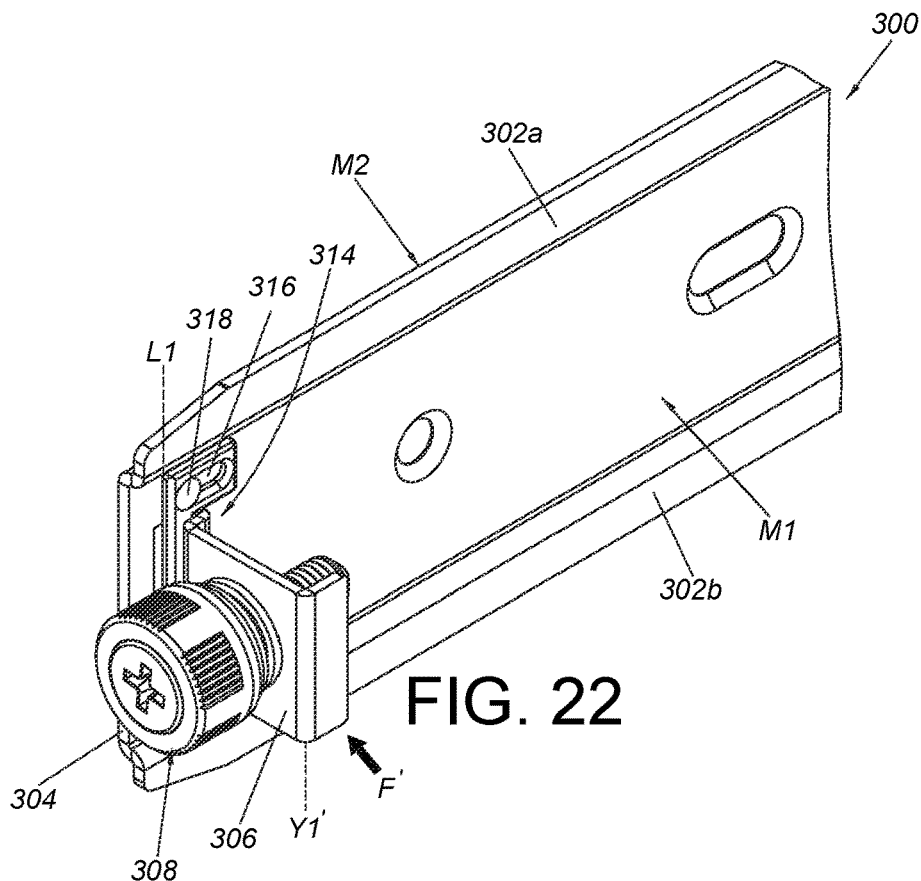
FIG. 22 is a diagram showing the locking base being located at a first transverse position relative to the second rail from a viewing angle according to the embodiment of FIG. 18 of the present invention.
Figure 23:
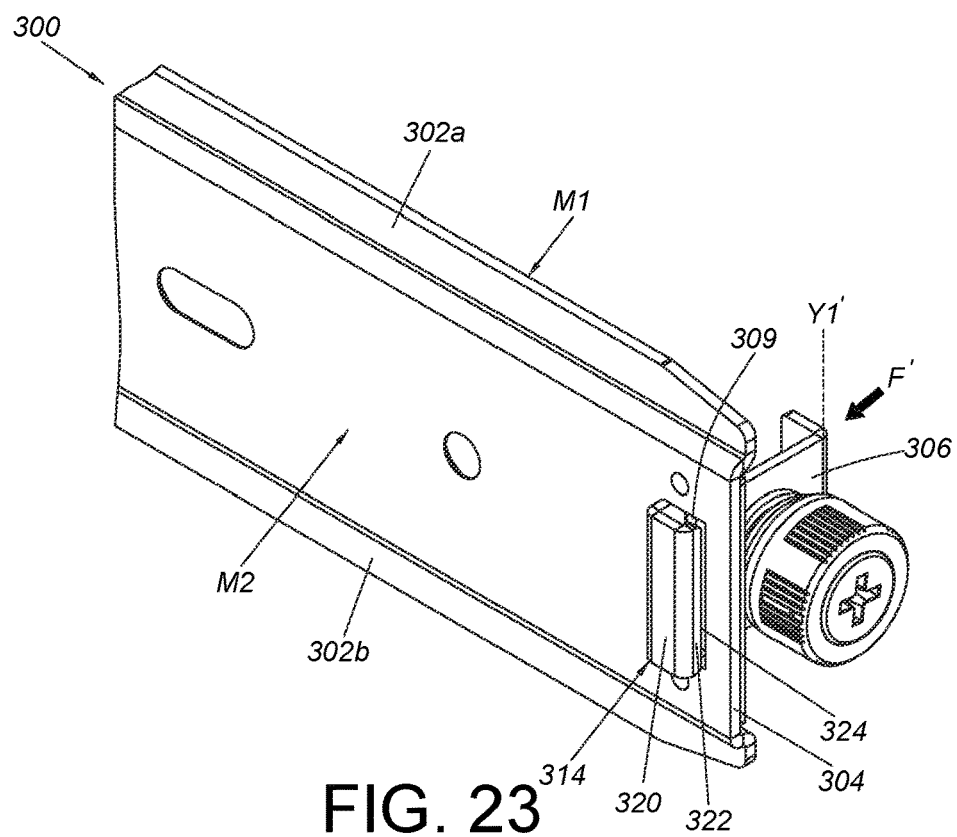
FIG. 23 is a diagram showing the locking base being located at the first transverse position relative to the second rail from another viewing angle according to the embodiment of FIG. 18 of the present invention.

As shown in FIG. 22 and FIG. 23, when an external force F' is applied to the locking base 306, the locking base 306 is transversely moved relative to the longitudinal wall 304 of the second rail 300 from the second transverse position Y2' to the first transverse position Y1'. Specifically, the locking base 306 can be moved from the second transverse position Y2' to the first transverse position Y1' through the predetermined space 309. When the locking base 306 is located at the first transverse position Y1', the side part 320 of the locking base 306 is extended beyond the second side M2 of the longitudinal wall 304 of the second rail 300. In such state, the bending feature 322 of the connecting section 314 of the locking base 306 and the edge wall 324 of the predetermined space 309 of the longitudinal wall 304 of the second rail 300 no longer block each other (as shown in FIG. 23).

Figure 24:
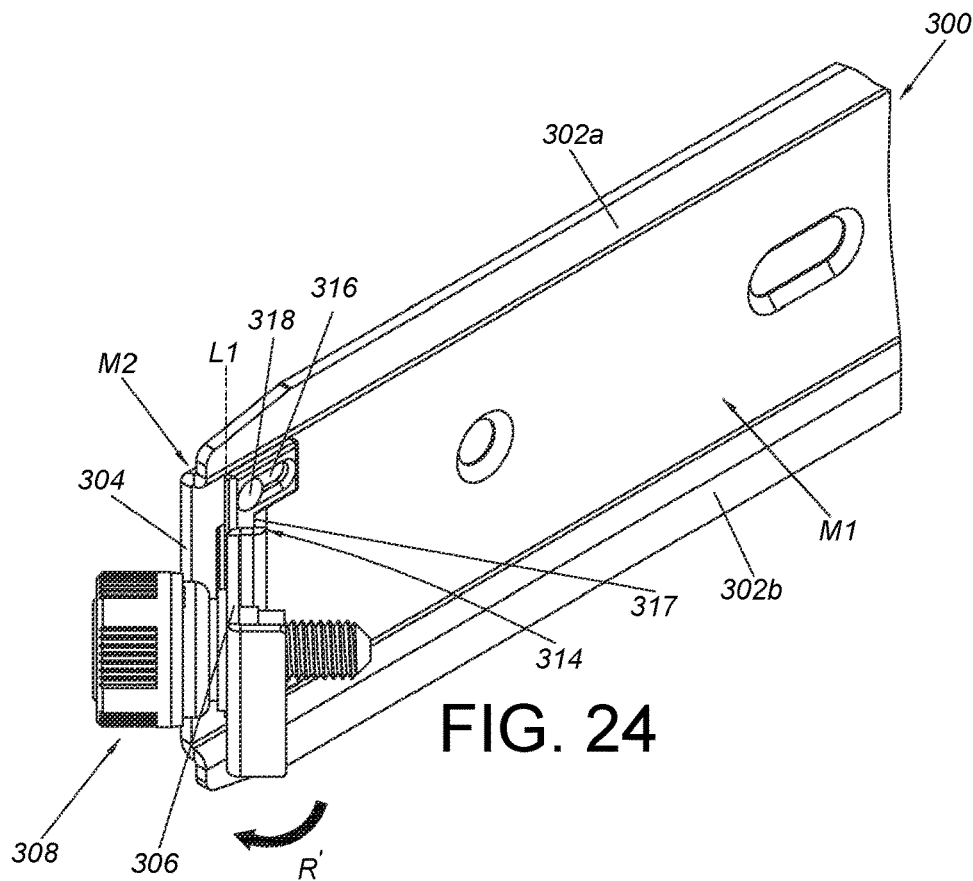
FIG. 24 is a diagram showing a process of the locking base being moved relative to the second rail from the closed state to the open state according to the embodiment of FIG. 18 of the present invention.
Figure 25:
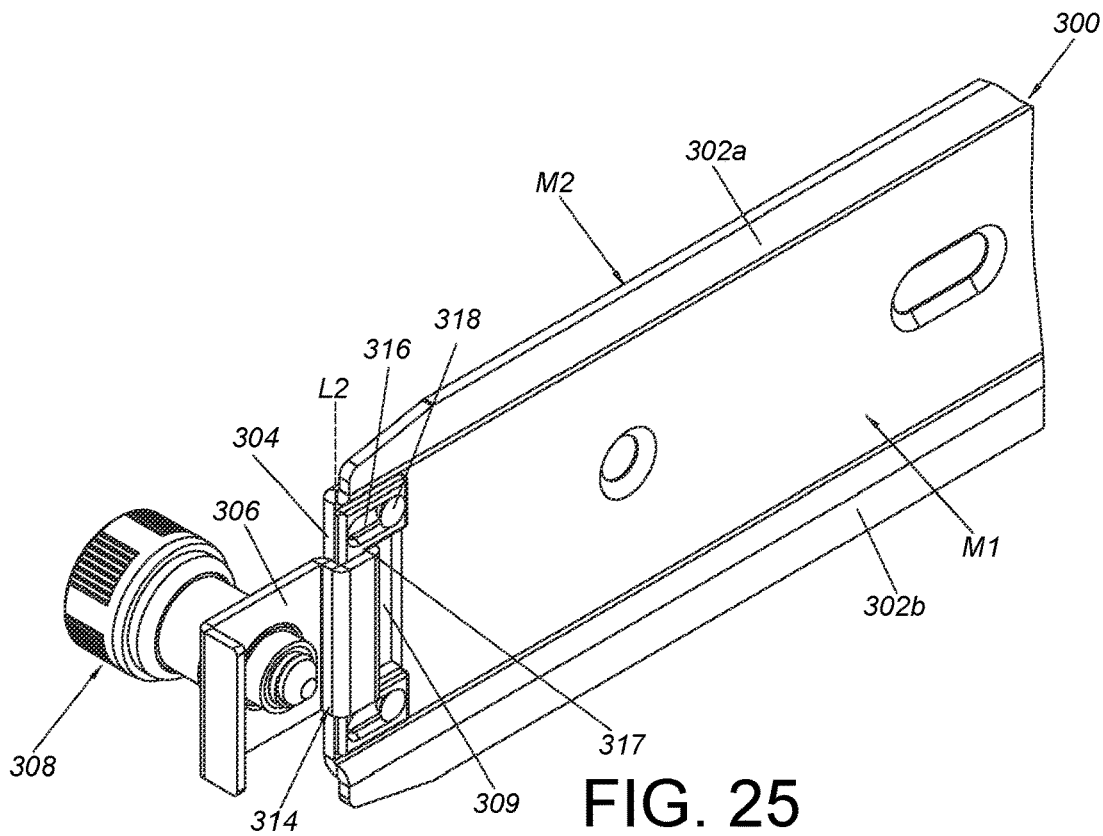
FIG. 25 is a diagram showing the locking base being in the open state relative to the second rail according to the embodiment of FIG. 18 of the present invention.

As shown in FIG. 24 and FIG. 25, when the locking base 306 is located at the first transverse position Y1', the bending feature 322 of the connecting section 314 of the locking base 306 and the edge wall 324 of the predetermined space 309 of the longitudinal wall 304 of the second rail 300 no longer block each other, such that the locking base 306 can be operated to rotate in a predetermined direction R' from the closed state to the open state (as shown in FIG. 25). Moreover, during a process of the locking base 306 being moved from the closed state to the open state, a portion 317 of the connecting section 314 of the locking base 306 (such as an inner wall surface of the connecting space S' of the connecting section 314) can drive the auxiliary member 310 to move from the first longitudinal position L1 (as shown in FIG. 24) to a second longitudinal position L2 (as shown in FIG. 25).

Figure 26:
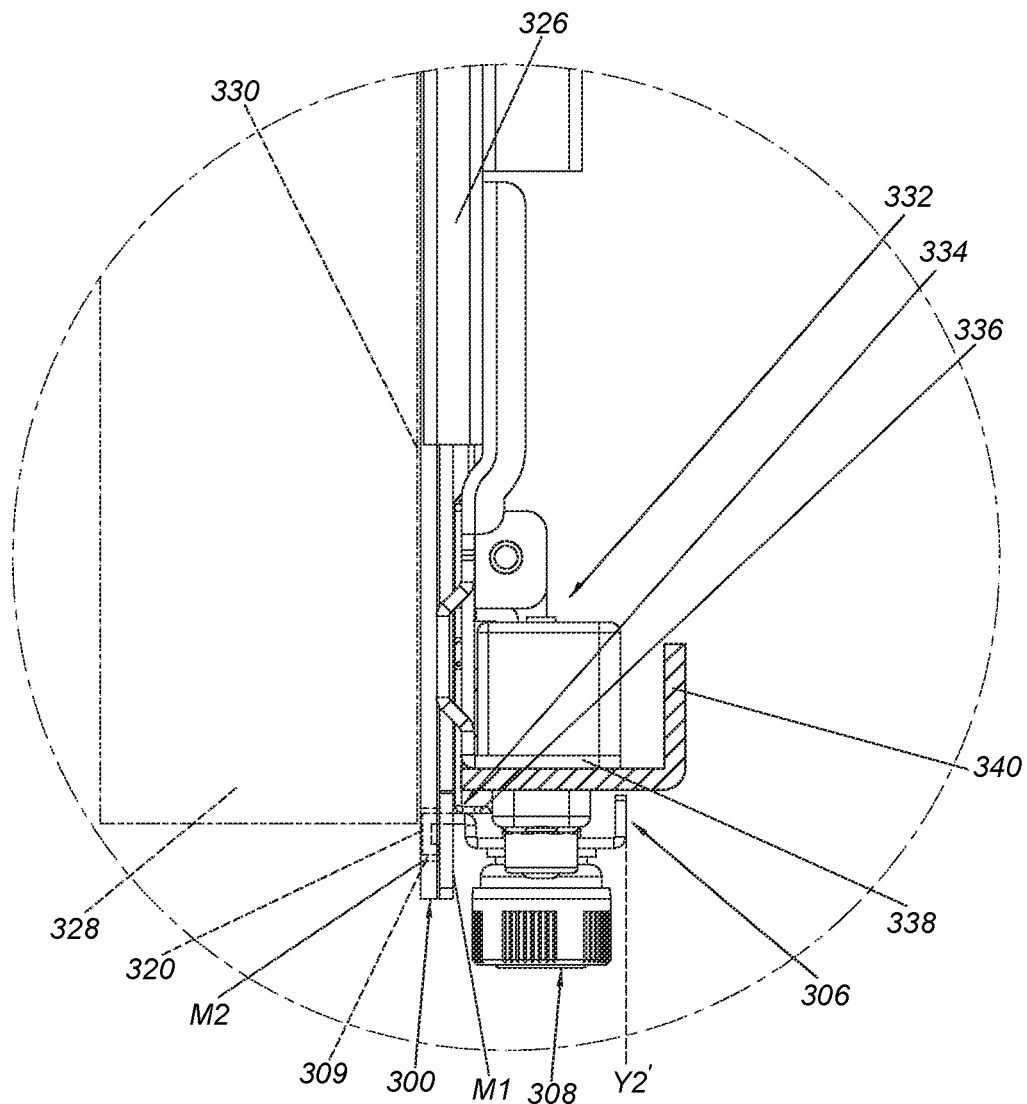
FIG. 26 is a partial view of the slide rail assembly being applied to the rack with the locking base being located at the second transverse position relative to the second rail according to the embodiment of FIG. 18 of the present invention.

As shown in FIG. 26, the second side M2 of the second rail 300 is configured to carry a carried object 328. When the second rail 300 is located at a predetermined position (such as a retracted position) relative to the first rail 326, the locking base 306 can be operated to be located at the second transverse position Y2' and in the closed state. Since the side part 320 of the locking base 306 is not extended beyond the second side M2 of the longitudinal wall 304 of the second rail 300, the side part 320 of the locking base 306 does not interfere with a lateral surface 330 of the carried object 328 carried by the second rail 300. Such arrangement has an advantage in that the lateral surface 330 of the carried object 328 can be as close as possible to the second side M2 of the longitudinal wall 304 of the second rail 300, so as to prevent a transverse gap from forming between the lateral surface 330 of the carried object 328 and the second side M2 of the longitudinal wall 304 of the second rail 300. Therefore, when the carried object 328 is going to be mounted to the second rail 300, the lateral surface 330 of the carried object 328 can be easily fastened to the second side M2 of the longitudinal wall 304 of the second rail 300 through a fastening member (such as a screw or a bolt).

Moreover, when the second rail 300 is located at the retracted position relative to the first rail 326 with the locking base 306 being in the closed state, the locking member 308 (or the threaded part of the locking member 308) is configured to be correspondingly fastened into the locking para of the front bracket 332 (such arrangement is disclosed in the two aforementioned embodiments, for simplification, no further illustration is provided). For pulling the carried object 328 out of the front post 340, the user only needs to detach the locking member 308 from the locking part of the front bracket 332 before pulling out the carried object 328.

Preferably, the fastening member 334 of the slide rail assembly is movably mounted to the front bracket 332. When the fastening member 334 is located at the locking position, the fastening part 336 of the fastening member 334 is in front of the end plate 338 of the front bracket 332 or the front post 340, so as to lock the front post 340.

Therefore, the slide rail assembly 20 according to the embodiments of the present invention is characterized in that:

1. When the second rail 26 is located at the retracted position P1 relative to the first rail 22 with the locking base 40 being in the closed state K2, the locking member 42 is able to be fastened into the locking part 38 of the front bracket 24, so as to prevent the second rail 26 from being moved relative to the first rail 22 from the retracted position P1 to the extended position P2. According to such arrangement, when the slide rail assembly 20 is applied to the rack, the second rail 26 is prevented from being moved relative to the first rail 22 from the retracted position P1 to the extended position P2, such that the carried object 68 is held in the rack without being freely moved outside the rack.
2. The locking base 40 is transversely adjustable relative to the second rail 26.
3. The locking part 202 of the front bracket 200 is arranged on the fastening part of fastening member, such that the locking part 202 is in front of the end plate 201 or the post 214 in order to reduce the distance between the threaded part of the locking member 212 and the locking part 202.
4. The locking base 306 can be operated to be located at the second transverse position Y2' and in the closed state. Since the side part 320 of the locking base 306 is not extended beyond the second side M2 of the longitudinal wall 304 of the second rail 300, the side part 320 of the locking base 306 does not interfere with the lateral surface 330 of the carried object 328 carried by the second rail 300. Such arrangement has an advantage in that the lateral surface 330 of the carried object 328 can be as close as possible to the second side M2 of the longitudinal wall 304 of the second rail 300, so as to prevent a transverse gap from forming between the lateral surface 330 of the carried object 328 and the second side M2 of the longitudinal wall 304 of the second rail 300.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail;
a bracket arranged on the first rail, the bracket having a locking part;
a second rail movable relative to the first rail from a retracted position to an extended position; and
a locking device arranged on the second rail, the locking device comprising a locking base and a locking member, wherein the locking base is configured to be operated relative to the second rail to be in one of an open state and a closed state; wherein when the locking base is in the closed state, the locking member corresponds to the locking part of the bracket; wherein when the locking base is in the open state, the locking member is away from the locking part of the bracket; wherein when the second rail is located at the retracted position relative to the first rail with the locking base being in the closed state, the locking member is able to be fastened into the locking part of the bracket, so as to prevent the second rail from being moved relative to the first rail from the retracted position to the extended position;

wherein the bracket comprises a side plate and an end plate substantially perpendicularly connected to the side plate, two mounting members are arranged on the end plate, and the locking part is located between the two mounting members;

wherein the locking device is arranged adjacent to a front end part of the second rail, the locking part is a screw hole, the locking member comprises an operating part and a threaded part connected to the operating part, and the threaded part and the locking part have screwing structures matching each other.

2. The slide rail assembly of claim 1, wherein a fixing base is connected to an inner side of an end part of the second rail, the fixing base is extended beyond the end plate of the bracket, the fixing base has a hole, and the locking base has a connecting section passing through the hole of the fixing base in order to connect the locking base to the fixing base.

3. The slide rail assembly of claim 2, wherein the fixing base has a predetermined thickness, the connecting section of the locking base defines a bounded connecting space, an internal width of the connecting space is greater than the predetermined thickness, to allow the locking base to be transversely adjustable relative to the fixing base, wherein the locking base has a bending section adjacent to the end plate of the bracket.

4. The slide rail assembly of claim 1, wherein when the locking base is in the closed state and the locking member is fastened into the locking part of the bracket, the locking base and the second rail are substantially located on a same longitudinal plane.

5. The slide rail assembly of claim 1, further comprising a fastening member movably mounted to the bracket, wherein when the fastening member is located at a locking position, a fastening part of the fastening member is adjacent to the end plate of the bracket.

6. A slide rail assembly, comprising:
a first rail;
a bracket arranged on the first rail, the bracket comprising a fastening member and a locking part arranged on the fastening member;
a second rail movable relative to the first rail from a retracted position to an extended position; and
a locking device arranged on the second rail, the locking device comprising a locking base and a locking member, wherein the locking base is configured to be operated relative to the second rail to be in one of an open state and a closed state; wherein when the locking base is in the closed state, the locking member corresponds to the locking part of the bracket; wherein when the locking base is in the open state, the locking member is away from the locking part of the bracket;
wherein when the second rail is located at the retracted position relative to the first rail with the locking base being in the closed state, the locking base has a feature configured to abut against a front end part of the second rail or to shorten a gap between the locking base and the front end part of the second rail;
wherein when the second rail is located at the retracted position relative to the first rail with the locking base being in the closed state, the locking member is able to be fastened into the locking part of the bracket;
wherein the bracket comprises a side plate and an end plate substantially perpendicularly connected to the side plate, two mounting members are arranged on the end plate, and the locking part is located between the two mounting members;

wherein the locking device is arranged adjacent to the front end part of the second rail, the locking part is a screw hole, the locking member comprises an operating part and a threaded part connected to the operating part, and the threaded part and the locking part have screwing structures matching each other.

7. The slide rail assembly of claim 6, wherein a fixing base is connected to an inner side of an end part of the second rail, the fixing base is extended beyond the end plate of the bracket, the fixing base has a hole, and the locking base has a connecting section passing through the hole of the fixing base in order to connect the locking base to the fixing base.

8. The slide rail assembly of claim 7, wherein the fixing base has a predetermined thickness, the connecting section of the locking base defines a bounded connecting space, an internal width of the connecting space is greater than the predetermined thickness, to allow the locking base to be transversely adjustable relative to the fixing base, wherein the locking base has a bending section adjacent to the end plate of the bracket.

9. The slide rail assembly of claim 6, wherein when the locking base is in the closed state and the locking member is fastened into the locking part of the bracket, the locking base and the second rail are substantially located on a same longitudinal plane.

10. The slide rail assembly of claim 6, wherein the fastening member is movably mounted to the bracket, when the fastening member is located at a locking position, a fastening part of the fastening member is in front of the end plate of the bracket, and the locking part is arranged on the fastening part of the fastening member.

11. A slide rail assembly, comprising:
a first rail;
a bracket arranged on the first rail, the bracket comprising a locking part;
a second rail movable relative to the first rail from a retracted position to an extended position, the second rail comprising a first wall, a second wall and a longitudinal wall connected between the first wall and the second wall of the second rail, the longitudinal wall of the second rail having a first side and a second side opposite to the first side; and
a locking device arranged on the second rail, the locking device comprising a locking base and a locking member, wherein the locking base is transversely movable relative to the longitudinal wall of the second rail between a first transverse position and a second transverse position, and the locking base is configured to be operated relative to the second rail to be in one of an open state and a closed state;
wherein when the locking base is located at the second transverse position and in the closed state, a side part of the locking base is not extended beyond the second side of the longitudinal wall of the second rail;
wherein when the second rail is located at the retracted position relative to the first rail with the locking base being in the closed state, the locking member is able to be fastened into the locking part of the bracket;
wherein when the locking base is located at the first transverse position, the side part of the locking base is extended beyond the second side of the longitudinal wall of the second rail.

12. The slide rail assembly of claim 11, wherein the bracket comprises a side plate and an end plate substantially perpendicularly connected to the side plate, two mounting members are arranged on the end plate, and the locking part is located between the two mounting members.

13. The slide rail assembly of claim 12, wherein the locking base has a bending section adjacent to the end plate of the bracket, wherein the slide rail assembly further comprises a fastening member, the fastening member is movably mounted to the bracket; wherein when the fastening member is located at a locking position, a fastening part of the fastening member is in front of the end plate of the bracket.

14. The slide rail assembly of claim 11, wherein the longitudinal wall of the second rail is formed with a predetermined space, and the locking base is movable between the second transverse position and the first transverse position through the predetermined space.

15. The slide rail assembly of claim 14, further comprising an auxiliary member movably mounted to the first side of the longitudinal wall of the second rail, wherein the auxiliary member has a supporting part adjacent to the predetermined space, the locking base has a connecting section, the supporting part has a predetermined thickness, the connecting section of the locking base defines a bounded connecting space, an internal width of the connecting space is greater than the predetermined thickness, to allow the locking base to be transversely adjustable relative to the auxiliary member, wherein the auxiliary member and the longitudinal wall of the second rail are longitudinally movable relative to each other within a limited range through arrangement of a first connecting feature and a second connecting feature.

\* \* \* \* \*